(12) United States Patent
Zhu et al.

(10) Patent No.: US 11,444,256 B2
(45) Date of Patent: Sep. 13, 2022

(54) FILTER-FREE TUNABLE SPECTRUM PHOTODETECTORS

(71) Applicant: Hong Kong Baptist University, Hong Kong (HK)

(72) Inventors: Furong Zhu, Hong Kong (HK); Zhaojue Lan, Hong Kong (HK)

(73) Assignee: Hong Kong Baptist University, Hong Kong (HK)

( * ) Notice: Subject to any disclaimer, the term of this patent is extended or adjusted under 35 U.S.C. 154(b) by 80 days.

(21) Appl. No.: 16/908,694

(22) Filed: Jun. 22, 2020

(65) Prior Publication Data

US 2020/0411782 A1 Dec. 31, 2020

Related U.S. Application Data

(60) Provisional application No. 62/866,002, filed on Jun. 25, 2019.

(51) Int. Cl.
*H01L 31/101* (2006.01)
*H01L 51/42* (2006.01)
*H01L 51/44* (2006.01)

(52) U.S. Cl.
CPC ........ *H01L 51/4266* (2013.01); *H01L 51/442* (2013.01)

(58) Field of Classification Search
CPC .... H01L 31/09; H01L 31/085; H01L 31/1013
See application file for complete search history.

(56) References Cited

U.S. PATENT DOCUMENTS

| 2014/0020739 A1* | 1/2014 | Yang | H01L 51/0036 528/367 |
| 2015/0014627 A1* | 1/2015 | Yu | H01L 27/14683 257/77 |
| 2018/0138330 A1* | 5/2018 | Choi | G06F 30/39 |

OTHER PUBLICATIONS

Ardalan Armin et al., "Narrowband Light Detection via Internal Quantum Efficiency Manipulation of Organic Photodiodes", Nature Communications, Feb. 27, 2015, pp. 1-8.

(Continued)

*Primary Examiner* — Jae Lee
(74) *Attorney, Agent, or Firm* — Idea Intellectual Limited; Margaret A. Burke; Sam T. Yip

(57) ABSTRACT

This invention provides a filter-free tunable spectrum PD with a layered structure of at least two electrodes and two functional layers. Both functional layers can be a layer, a stack of inorganic semiconductors, an organic semiconductor, an organic/polymer donor/acceptor blend, a hybrid semiconductor or their combinations that has a good charge transport property. The first functional layer absorbs the shorter-wavelength EM waves and is transparent to the longer-wavelength EM waves. The second functional layer absorbs the longer-wavelength EM waves. The detection spectrum window is determined by the difference in wavelengths between the transmission cut-off wavelength of the first functional layer and absorbing edge of the second functional layer, or between the absorption edge of the first functional layer and that of the second functional layer. The present PDs can be used in imaging, thermal therapy, night-vision, Li-Fi, optical communication, environmental detection, agricultural, wellness, bioimage, food, automotive and security monitoring.

19 Claims, 28 Drawing Sheets

(56) References Cited

OTHER PUBLICATIONS

Qianqian Lin et al., "Filterless Narrowband Visible Photodetectors", Nature Photonics, Sep. 14, 2015, pp. 1-9.
Yanjun Fang et al., "Highly Narrowband Perovskite Single-Crystal Photodetectors Enabled by Surface-Charge Recombination", Nature Photonics, Aug. 31, 2015, pp. 1-9.
Bernhard Siegmund et al., "Organic Narrowband Near-Infrared Photodetectors Based on Intermolecular Charge-Transfer Absorption", Nature Communications, Jun. 5, 2017, pp. 1-6.
Andreas Mischok et al., "Controlling Tamm Plasmons for Organic Narrowband Near-Infrared Photodetectors", ACS Photonics, Aug. 8, 2017, pp. 2228-2234.

\* cited by examiner

FILTER-FREE TUNABLE SPECTRUM PHOTODETECTORS

CROSS REFERENCE OF RELATED APPLICATION

This application claims the benefit of priority of U.S. Provisional Patent Application Ser. No. 62/866,002 filed on Jun. 25, 2019, which is hereby incorporated by reference in its entirety for all purposes.

FIELD OF THE INVENTION

The present invention relates the high-performance filter-free tunable spectrum photodetectors (PDs) that comprise a layer configuration of first electrode/first functional layer/second functional layer/second electrode. The filter-free tunable spectrum PDs can be used for applications in thermal imaging, thermal therapy, night-vision, light fidelity (Li-Fi), light communication, optical communication, environmental detection, agricultural, wellness, food, bioimage, automotive and security monitoring.

BACKGROUND OF THE INVENTION

Filter-free tunable spectrum PDs over different wavelength ranges, e.g., UV light, visible light, near-infrared (NIR), short-wavelength infrared, middle-wavelength infrared and long-wavelength infrared, are very useful for applications in thermal imaging, thermal therapy, night-vision, Li-Fi, light communication, optical communication, environmental detection, agricultural, wellness, food, bioimage, automotive, Li-Fi, light communication and optical communication. The present available commercial PDs are fabricated mainly using inorganic electromagnetic (EM) wave absorbing materials, such as silicon (Si) and III-V compound semiconductors, etc. These commercial PDs generally exhibit broadband photoresponsivity, e.g., from UV to infrared (IR) EM wave range. These PDs usually require an external optical filter to block the undesired EM waves outside the detection spectrum window, and thereby improving the detection spectral selectivity and sensitivity.

The filter-free tunable spectrum, e.g., the selected IR wavelength range, PDs are attractive for different IR detection applications, e.g., colorimetric measurements, Li-Fi, light communication, optical communication, light barriers, or reflective optical sensors. However, the visible light can easily disturb the detection of the IR light, as the IR PDs are usually operated in an environment with the presence of the visible light. The selected detection spectrum window for commercial IR PDs, made by Si- or III-V compound semiconductor materials, are realized by incorporating different external optical filters. The Si- and III-V compound-based PDs have some technical limitations: 1) PDs with a ~3 μm thick active layer are often used due to the low absorption coefficient in inorganic semiconductors. 2) The use of the external optical filters reduces the overall PD sensitivity, aiding in additional device integration complexity and manufacturing cost. 3) The fabrication of these inorganic semiconductor PDs involves high processing temperature, high-energy consumption and vacuum fabrication process, and 4) they are fragile and not suitable for making flexible large area PDs. To address the above technical issues, much effort has devoted to developing highly sensitive filter-free tunable spectrum PDs using solution-processable semiconductor materials.

Solution-processable organic and hybrid semiconductors have attracted many interests for applications in filter-free PDs with tunable spectral detection of EM waves. Most solution-processable semiconducting materials have broadband absorbance, narrowband PDs are realized through device designing. The charge collection narrowing (CCN) device concept was proposed for achieving narrowband spectral detection, e.g., in red light and NIR wavelength ranges, using broadband absorbing materials. In the CCN-type PDs, a very thick light-absorbing layer, e.g., ≥2 μm, is used to deplete the photogenerated charges generated near the surface of the photoactive layer. However, the use of a thick light-absorbing layer in PDs has some drawbacks: 1) the increased material cost associated with the large material consumption and process difficulties, 2) a narrow band response of the thick PDs is realized at a cost of the reduction in the responsivity as compared to the thin film type PDs, 3) PDs with a thick light-absorbing layer reduces the response speed. A microcavity PD is used to obtain narrow band detection with limited responsivity and high angular dependent photoresponses. Microcavity PDs are also used for NIR detection, where a highly reflective distributed Bragg reflector (DBR) is used to form a wavelength selective resonant cavity. Microcavity PDs with a DBR reflector have a typical narrowband photodetection in the NIR wavelength range, with a full width at half maximum (FWHM) of <20 nm. However, the fabrication of the DBR reflector requires a precise wavelength matching condition and costly process. The microcavity configuration PD is highly angular dependent and has limitations for realizing filter-free tunable spectrum PDs.

Definition

The following abbreviations used herein refer to their corresponding chemical name or equivalents which a skilled artisan would use to define as such:

P3HT: poly(3-hexylthiophene-2,5-diyl)
PBDB-T: poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]
PDPP3T: poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophen-2,5-diyl}
m-ITIC: 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene
PTB7-Th: poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)]
$CO_i8DFIC$: 2,2'-[[4,4,11,11-tetrakis(4-hexylphenyl)-4,11 dihydrothieno[2',3':4,5]thieno[2,3-d]thieno[2'''',3'''':4''',5''']thieno[2''',3''':4'',5'']pyrano[2'',3'':4',5']thieno[2',3':4,5]thieno[3,2-b]pyran-2,9-diyl]bis[methylidyne(5,6-difluoro
$PC_{70}BM$: [6,6]-Phenyl-C71-butyric acid methyl ester
PCPDTBT: poly[2,6-(4,4-bis-(2-ethylhexyl)-4H-cyclopenta [2,1-b;3,4-b']dithiophene)-alt-4,7(2,1,3-benzothiadiazole)]

Full name of some blends described herein are as follows:
PBDB-T:m-ITIC: poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)]:poly{2,2'-[(2,5-bis(2- hexyldecyl)-3,6-dioxo-2,3,5,6-tetrahydropyrrolo[3,4-c]
pyrrole-1,4-diyl)dithiophene]-5,5'-diyl-alt-thiophen-2,5-
diyl}

PDPP3T:m-ITIC: poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophen-2,5-diyl}:3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene PTB7-Th:CO$_i$8DFIC:PC$_{70}$BM: poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)]:2,2'-[[4,4,11,11-tetrakis(4-hexylphenyl)-4,11-dihydrothieno[2',3':4,5]thieno[2,3-d]thieno[2''',3''':4''',5''']thieno[2'',3'':4'',5'']pyrano[2'',3'':4',5']thieno[2',3':4,5]thieno[3,2-b]pyran-2,9-diyl]bis[methylidyne(5,6-difluoro:[6,6]-Phenyl-C71-butyric acid methyl ester PTB7-Th:PC$_{70}$BM: poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)]:[6,6]-Phenyl-C71-butyric acid methyl ester PCPDTBT:PC$_{70}$BM: poly[2,6-(4,4-bis-(2-ethylhexyl)-4H-cyclopenta [2,1-b;3,4-b']dithiophene)-alt-4,7(2,1,3-benzothiadiazole)]:[6,6]-Phenyl-C71-butyric acid methyl ester

SUMMARY OF THE INVENTION

Accordingly, it is an objective of the present invention to provide a high-performance filter-free tunable spectrum PDs comprising a layered structure of at least two electrodes and at least two functional layers, e.g., an assembly of first electrode/first functional layer/second functional layer/second electrode. The first electrode being more proximal to an incident light can be a transparent or a semi-transparent conductive layer with appropriate surface electronic properties that are suitable for charge extraction at the first electrode/first functional layer interface. The second electrode being more distal to the incident light can be a transparent, semi-transparent or an opaque conductive layer with appropriate surface electronic properties that are suitable for charge extraction at the second functional layer/second electrode interface. The first functional layer serves as a shorter-wavelength EM wave, selected over the wavelength range from 10 nm to 1000 μm, depletion layer, which can be a layer or a stack of inorganic semiconductors, or an organic semiconductor, or an organic/polymer donor/acceptor blend, or a hybrid semiconductor or their combinations that has a good charge transport property. The second functional layer can be a functional layer or a stack of functional layers or heterojunctions or a combination of functional layers and bulk heterojunctions absorbing the longer-wavelength EM waves selected over the wavelength range from 10 nm to 1000 μm. The filter-free tunable spectral detection is realized by adjusting the selected spectral response window within the afore-mentioned wavelength range, determined by the difference in wavelengths between the transmission cut-off wavelength of the first functional layer and the absorbing edge of the second functional layer.

In an embodiment, the first functional layer and the second functional layer are made of materials comprising organic, polymer, perovskite, colloidal quantum dots, and inorganic compounds, or any combination thereof.

In another embodiment, the shorter-wavelength EM wave depletion layer is selected from a P3HT layer, a PTB7-Th layer, a CH$_3$NH$_3$Pb$_{0.5}$Sn$_{0.5}$I$_3$ perovskite layer or a CH$_3$NH$_3$PbI$_3$ perovskite layer.

In other embodiment, the longer-wavelength EM wave absorbing layer is selected from a PBDB-T:m-ITIC blended layer, a PDPP3T:m-ITIC blended layer, PTB7-Th:CO$_i$8DFIC:PC$_{70}$BM blended layer, a PTB7-Th:PC$_{70}$BM blended layer or a PCPDTBT:PC$_{70}$BM blended layer.

In yet another embodiment, the photodetector is prepared by using solution fabrication, vacuum evaporation, printing processes, nanoimprinting, transfer processes, or any combination thereof.

In a further embodiment, the first functional layer can also be an absorption layer for absorbing the shorter-wavelength EM waves.

In other embodiment, the second functional layer is an absorption layer for absorbing the longer-wavelength EM waves.

In an embodiment, the at least two electrodes comprise transparent conducting oxides, thin metal layer, conducting polymers, organic semiconductors, nanostructured transparent electrode, metal nanoparticles, metal nanowires, graphene sheets, or any combination thereof.

In another embodiment, the first electrode is selected from a poly(3,4-ethylenedioxythiophene)-polystyrene sulfonate (PEDOT:PSS) layer, an indium tin oxide (ITO) layer, a surface modified PEDOT:PSS layer or a surface modified ITO layer; the second electrode is from an aluminum (Al) layer, silver (Ag) layer, zinc oxide (ZnO)-modified Al layer or ZnO-modified Ag layer.

In yet another embodiment, the layered structure further comprises an interlayer sandwiched between a first functional layer and a second functional layer of the at least two functional layers.

In other embodiment, the interlayer comprised in the layered structure is configured to assist charge exchange and comprising conducting polymer, metal oxide, self-assembled monolayer, metal nanoparticles, metal nanowires, graphene sheets, or any combination thereof.

The present photodetector has a photoresponse to a selected spectrum window within a wavelength range from 10 nm to 1000 μm and is operable with or without bias.

Those skilled in the art will appreciate that the invention described herein is susceptible to variations and modifications other than those specifically described.

The present invention includes all such variation and modifications. The invention also includes all the steps and features referred to or indicated in the specification, individually or collectively, and any and all combination or any two or more of the steps or features.

Other aspects and advantages of the present invention will be apparent to those skilled in the art from a review of the ensuing description.

DETAILED DESCRIPTION OF THE INVENTION

Figure 1:
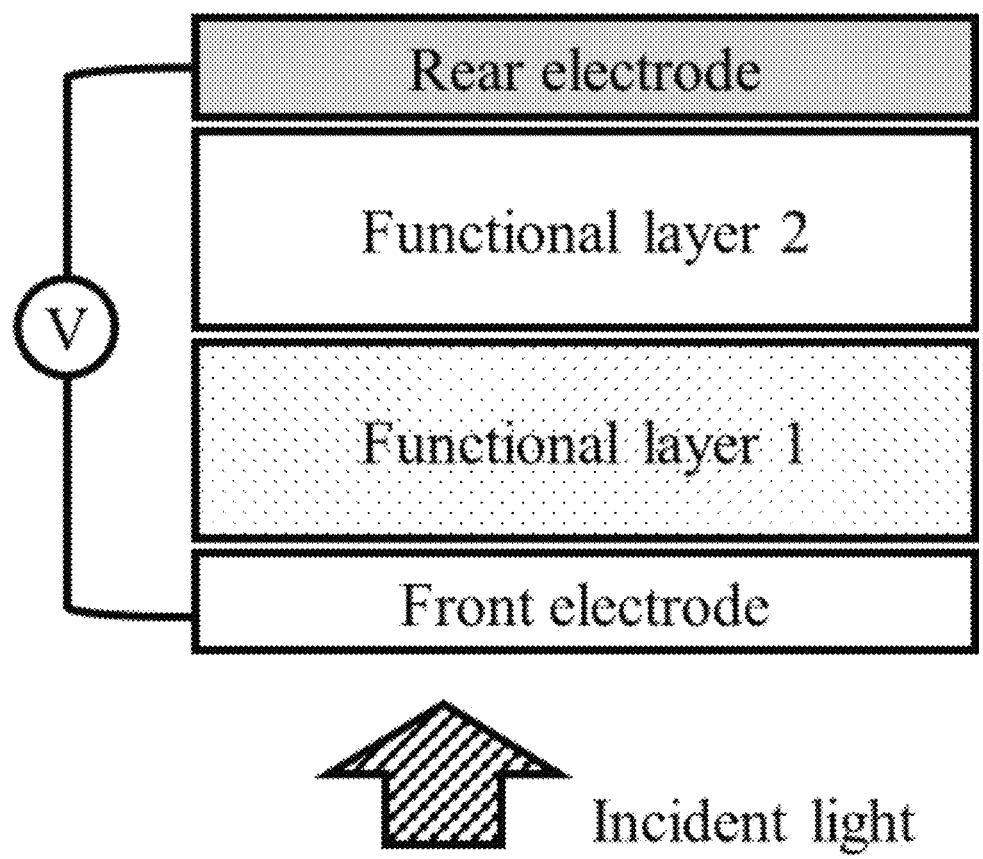
FIG. 1 shows the schematic cross-sectional view of the filter-free tunable spectrum photodetector (PD).

In the present patent application, the inventors disclose a universal filter-free tunable spectrum PD technology. The novel device concept and device configuration allow the filter-free tunable spectrum PDs that can be prepared using solution-processable fabrication processes. The filter-free tunable spectrum, e.g., visible light-blind tunable NIR detection, PDs have a multilayer configuration consisting of first electrode/first functional layer/second functional layer/second electrode. The first electrode can be a transparent or a semi-transparent conductive layer with appropriate surface electronic properties that are suitable for charge extraction at the first electrode/first functional layer interface. The second electrode can be a transparent, semi-transparent or an opaque conductive layer with appropriate surface electronic properties that are suitable for charge extraction at the second functional layer/second electrode interface. The first functional layer can be a layer or a stack of inorganic semiconductors, or an organic semiconductor, or an organic/polymer donor/acceptor blend, or a hybrid semiconductor or their combination that has a good charge transport property.

The first functional layer is an absorption layer absorbing shorter-wavelength electromagnetic waves, e.g., visible light, and is transparent to the longer-wavelength EM waves, e.g., NIR light. The first functional layer serves as a shorter-wavelength EM wave, depletion layer. The second functional layer can be a functional layer, a stack of functional layers or heterojunctions or a combination of functionals and bulk heterojunctions, absorbing the longer-wavelength EM waves. The novel filter-free tunable spectrum PDs have the following functions: (1) he first functional layer acts as a charge transporting layer. (2) The first functional layer is a shorter wavelength EM wave, depletion layer. (3) The first functional layer is transparent to the longer-wavelength EM waves. (4) The second functional layer serves as a longer-wavelength EM wave, absorbing layer. (5) The filter-free tunable spectral detection is realized by adjusting the selected spectral response window, determined by the difference in wavelengths between the transmission cut-off wavelength of the first functional layer and the absorbing edge of the second functional layer, or the difference in the wavelength between the absorption edge of the first functional layer and that of the second functional layer. The photoresponsivity of the filter-free tunable spectrum PDs disclosed in the present patent application can be effectively controlled by modulating the distribution of the optical field and photo-generated charge carriers in the stack of first functional layer/second functional layer structure. The filter-free tunable spectral response in the PDs can be adjusted for desired broadband and/or narrowband spectrum detection. The filter-free tunable spectrum PDs can be prepared by vacuum and/or non-vacuum fabrication processes, e.g., solution fabrication process, for applications in thermal imaging, thermal therapy, night-vision, Li-Fi, light communication, optical communication, environmental detection, agricultural, wellness, bioimage, food, automotive and security monitoring.

Methods

Preparation of the First Electrode

The first electrode is a transparent conductive layer with suitable surface electronic properties for charge extraction. The PDs have a first transparent conducting contact, which can be prepared using transparent conducting oxides, thin metal layer, conducting polymers, organic semiconductors, nanostructured transparent electrode, metal nanoparticles, metal nanowires, graphene sheets, and their combinations. The surface of the first transparent conducting contact can be modified using conducting polymer, metal oxide, self-assembled monolayer and the combination for enhancing charge transfer between the first functional layer and the first electrode, e.g., a PEDOT:PSS-modified ITO first electrode. The wet-cleaned ITO/glass substrates were treated with UV-plasma for 10 min prior to the PEDOT:PSS deposition. A 30-nm thick PEDOT:PSS layer was prepared by spin-coating at 2,500 rpm for 50 s following by a post-annealing at 150° C. for 10 min in air.

Deposition of the First Functional Layer

The first functional layer disclosed in this patent application can be a layer or a stack of inorganic semiconductors, or an organic semiconductor, or an organic/polymer donor/acceptor blend, or a hybrid semiconductor or their combinations. In examples #1, #2, and #3 PDs, a 430 nm thick P3HT layer (first functional layer) was prepared by spin-coating at 1500 rpm for 60 s using P3HT solution with a weight concentration of 60 mg/mL in 1,2-Dichlorobenzene (DCB). In example #4 PD and example #5 PD, an 800 nm thick PTB7-Th-based second functional layer was prepared by spin-coating. A 900 nm thick $CH_3NH_3Pb_{0.5}Sn_{0.5}I_3$ perovskite first functional layer, prepared by spin-coating, was used in the example #6 PD. In example #7 PD and example #8 PD, a 1700 nm thick $CH_3NH_3PbI_3$ perovskite first functional layer was prepared by spin-coating at 3000 rpm for 25 s using a 50 precursor solution.

Deposition of the Second Functional Layer

The second functional layer can be a heterojunction or a bulk heterojunction absorbing the longer-wavelength EM waves, e.g., NIR light. In example #1 PD, a 120 nm thick PBDB-T:m-ITIC second functional layer was prepared by spin-coating on $SiO_2$/Si wafer at 1750 rpm for 50 s, followed with a post-annealing at 140° C. for 30 min. In example #2 PD and example #4 PD, the PDPP3T:m-ITIC second functional layer was coated on $SiO_2$/Si wafer by spin-coating at 1100 rpm followed by a post-annealing at 100° C. for 10 min. In example #3 PD and example #5 PD, a 100 nm thick PTB7-Th:$CO_i$8DFIC:$PC_{70}$BM layer was deposited on $SiO_2$/Si wafer by spin-coating at 1100 rpm followed by a post-annealing at 100° C. for 10 min. The layers were overlaid on the first functional layer by transfer process using a polydimethylsiloxane mold. A 200 nm thick PTB7-Th:$PC_{70}$BM (second functional layer) layer was prepared by spin-coating using the blend solution and kept in the glove box, with $O_2$ and $H_2O$ levels <0.1 ppm, for 2 h prior to the proceeding device fabrication. The PCPDTBT:$PC_{70}$BM-based second functional layer used in example #8 PD was also prepared using the spin-coating process.

Deposition of the Second Electrode

In example #5 PD, example #6 PD, example #7 PD and example #8 PD, a 10 nm thick ZnO electron transporting layer was prepared by spin-coating at 2000 rpm for 50 s. The multilayer samples, comprising a layer configuration of ITO/PEDOT:PSS/first functional layer/second functional layer/ZnO, were then transferred to the adjacent vacuum chamber, with a base pressure of $5 \times 10^{-4}$ Pa, for depositing a second electrode, e.g., a 100 nm thick aluminum (Al) or silver (Ag) electrode.

Results and Discussion

The filter-free tunable spectral detection in the PDs is attained by the selected spectrum window, controlled by the difference in the wavelength between the transmission cutoff of the first functional layer and the absorbing edge of the second functional layer. The second functional layer enables to generate charge carriers upon absorption of longer-wavelength EM waves. The second functional layer can be prepared using a layer of functional semiconductor material or a stack of functional layers or heterojunctions or a combination of functional layers and bulk heterojunctions with binary, or ternary, or multi-components with desired electronic properties for producing high photocurrent in the presence of longer-wavelength EM waves. The first functional layer and second functional layer can be fabricated using the same materials or a combination of different materials. An interlayer between the first functional layer and the second functional layer can be used to assist in processing integration between the first functional layer and second functional layer. The interlayer can also be considered as part of the first functional layer, which is transparent to the longer-wavelength EM waves. A hole transporting layer and/or an electron transporting layer can be used at the first electrode/first functional layer and second functional layer/second electrode interfaces to assist charge extraction in the PDs.

The cross-sectional view of the PD is shown in FIG. 1. As an example, a transparent ITO/glass substrate can be used serving as the first transparent contact allowing EM waves to pass through. The electrode/polyethylene terephthalate or electrode/polyethylene naphthalate substrates may also be used for making flexible PDs. The PDs have a layer configuration consisting of first electrode/first functional layer/second functional layer/second electrode. Depending on the device configuration, the first electrode and second electrode may serve as either an anode or cathode to extract photo-generated charges. The device configuration can be anode/first functional layer/second functional layer/cathode or cathode/first functional layer/second functional layer/anode depending on the device design. First and second electrodes can be transparent or semi-transparent in the spectral range of interest to allow the incident EM wave passing through, one of them is transparent and one can be opaque, or both first and second electrodes can be transparent. The first electrode and second electrode can be modified using an interlayer to assist charge extraction. For example, the use of a PEDOT:PSS hole transporting layer is to enhance hole extraction, the use of a thin ZnO electron transporting layer helps to improve electron collection.

PD Characteristics

Figure 3:
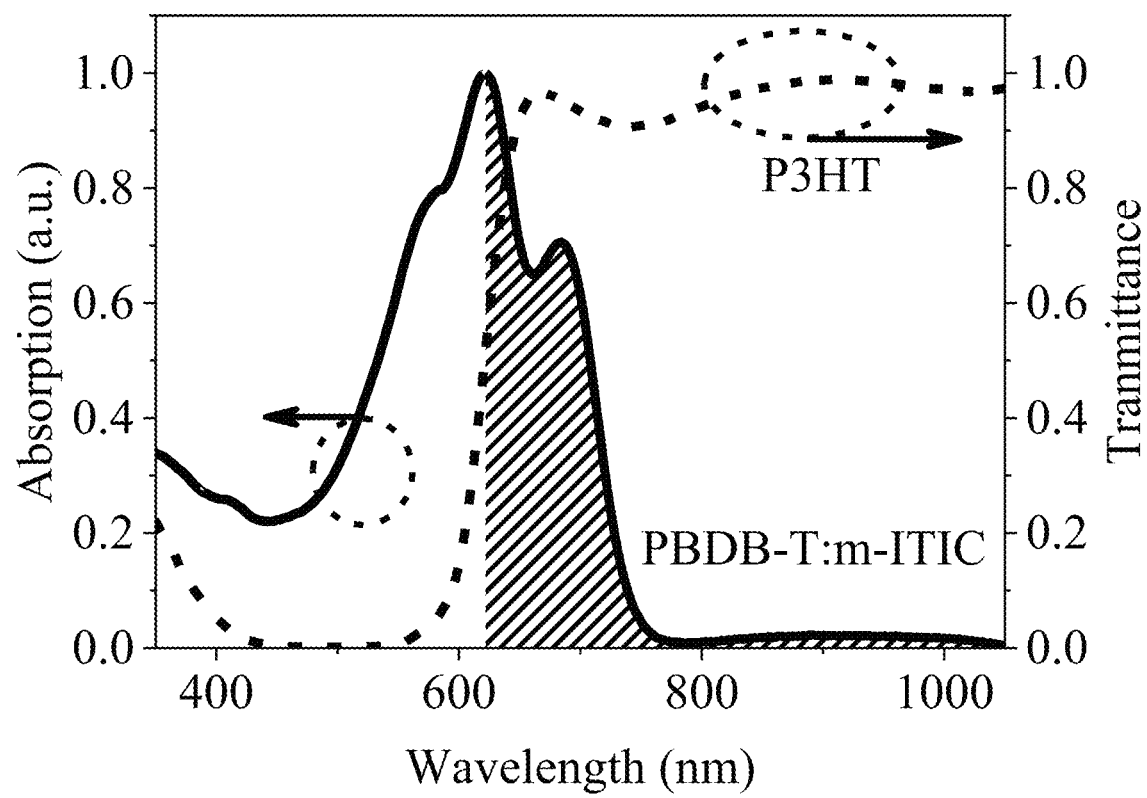
FIG. 3 shows the normalized absorption spectrum (solid curve) of a 120 nm PBDB-T:m-ITIC layer (second functional layer) and transmission spectrum (dashed curve) of a P3HT layer (first functional layer). The shaded area indicates the wavelength range of the incident light that can be detected selectively by the PBDB-T:m-ITIC layer (second functional layer) in the PD, determined by the difference in wavelengths between the transmission cut-off of a 430 nm thick P3HT layer and absorption edge of the 120 nm thick PBDB-T:m-ITIC layer.

Summaries of the results for example PDs discussed in this patent application are listed in Table 1 and Table 2 below.

the P3HT layer and absorption spectrum of the PBDB-T:m-ITIC layer are shown in FIG. 3. The P3HT layer acts as the visible light (shorter-wavelength EM wave) depletion layer to absorb the visible light with wavelength below 600 nm, and possess a high transparency to light with wavelength >600 nm simultaneously. The wavelength range of the selected detection spectrum window is determined by the difference in wavelengths between the transmission cut-off of the 430 nm thick P3HT layer and absorption edge of the 120 nm thick PBDB-T:m-ITIC layer. The shaded area in FIG. 3 represents the charge generation profile in the second functional layer.

Figure 4A:
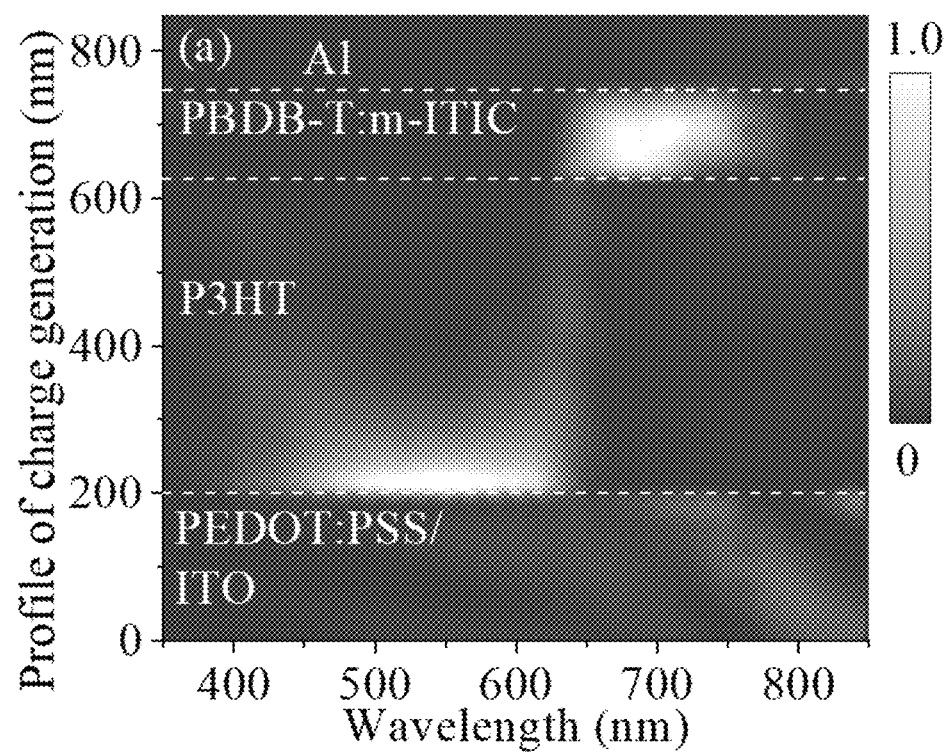
FIG. 4A shows the simulated photo-generated profile of the photo-generated charge carriers across the PD, indicating the spectral selectivity of the NIR absorption in the second functional layer (PBDB-T:m-ITIC) in example #1 PD.

The optical distribution in the example #1 PD was analyzed. The optical distribution was calculated using the optical admittance analysis. The density profile of absorbed photons across the P3HT layer (first functional layer) and PBDB-T:m-ITIC layer (second functional layer) in the PD as a function of wavelength is shown in FIG. 4A. It reveals clearly that the incident light with wavelength <600 nm is fully absorbed by a 430 nm thick P3HT shorter-wavelength light depletion layer allowing the longer wavelength light with wavelength >600 nm to penetrate the first functional layer and to be absorbed by the 120 nm thick PBDB-T:m-

TABLE 1

A summary of example filter-free PDs having tunable spectral detection capabilities.

| Examples of NIR PDs | Peak wavelength (nm) | FWHM (nm) | Responsivity (mA/W) @2.0 V | Bandwidth (kHz) (using a 1000 Ω @2.0 V) | Rise time (μs) | Fall time (μs) |
|---|---|---|---|---|---|---|
| #1 | 700 | 120 | 300 (0 V) | 15 | 26.8 | 69.9 |
| #2 | 725 | 240 | 120 | 43 | 14.1 | 24.2 |
| #3 | 870 | 340 | 360 | 17 | 21.8 | 50.4 |
| #4 | 830 | 115 | 83 | 20 | 3.6 | 112.4 |
| #5 | 870 | 210 | 360 (0 V) | 100 (using a 50 Ω resistor @ 0 V) | 6.2 | 7 |

TABLE 2

Examples of filter-free tunable spectrum PDs and the corresponding detection wavelength ranges.

| NIR PDs | First functional layer (thickness) | Second functional layer (thickness) | Detection range (nm) | FWHM (nm) |
|---|---|---|---|---|
| #1 | P3HT (430 nm) | PBDB-T: m-ITIC (120 nm) | 600–800 | 120 |
| #2 | P3HT (430 nm) | PDPP3T: m-ITIC (80 nm) | 600–950 | 240 |
| #3 | P3HT (430 nm) | PTB7-Th: CO$_i$8DFIC: PC$_{70}$BM (100 nm) | 600–1050 | 340 |
| #4 | PTB7-Th (800 nm) | PDPP3T: m-ITIC (80 nm) | 750–950 | 115 |
| #5 | PTB7-Th (800 nm) | PTB7-Th: CO$_i$8DFIC: PC$_{70}$BM (100 nm) | 750–1050 | 210 |
| #6 | CH$_3$NH$_3$Pb$_{0.5}$Sn$_{0.5}$I$_3$ (900 nm) | PTB7-Th: PC$_{70}$BM (200 nm) | 600–850 | 90 |
| #7 | CH$_3$NH$_3$PbI$_3$ (1700 nm) | PTB7-Th: PC$_{70}$BM (200 nm) | 750–850 | 50 |
| #8 | CH$_3$NH$_3$PbI$_3$ (1700 nm) | PCPDTBT: PC$_{70}$BM (120 nm) | 750–1000 | 100 |

Example #1

Figure 2:
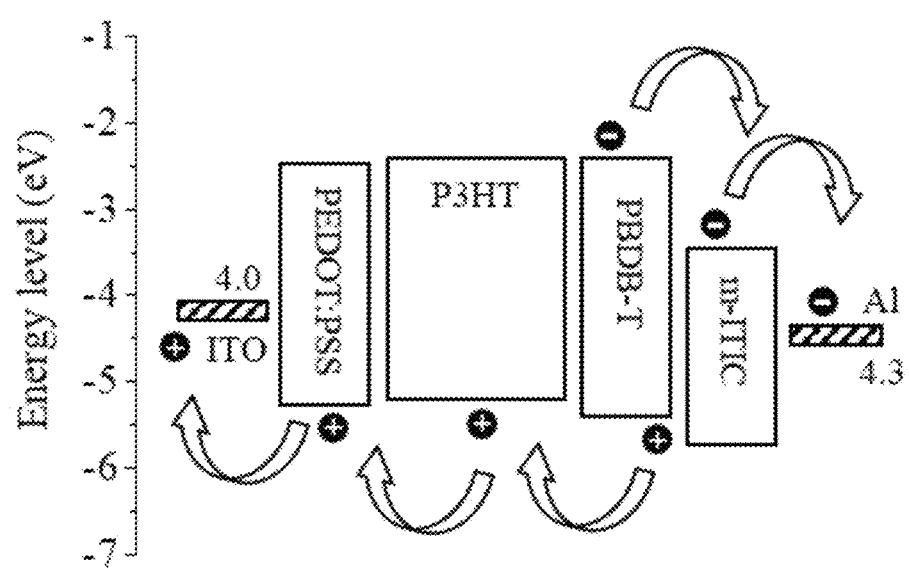
FIG. 2 shows the schematic energy level diagram of the ITO/PEDOT:PSS/P3HT/PBDB-T:m-ITIC/Al based filter-free tunable spectrum PD (example #1).
Figure 4B:
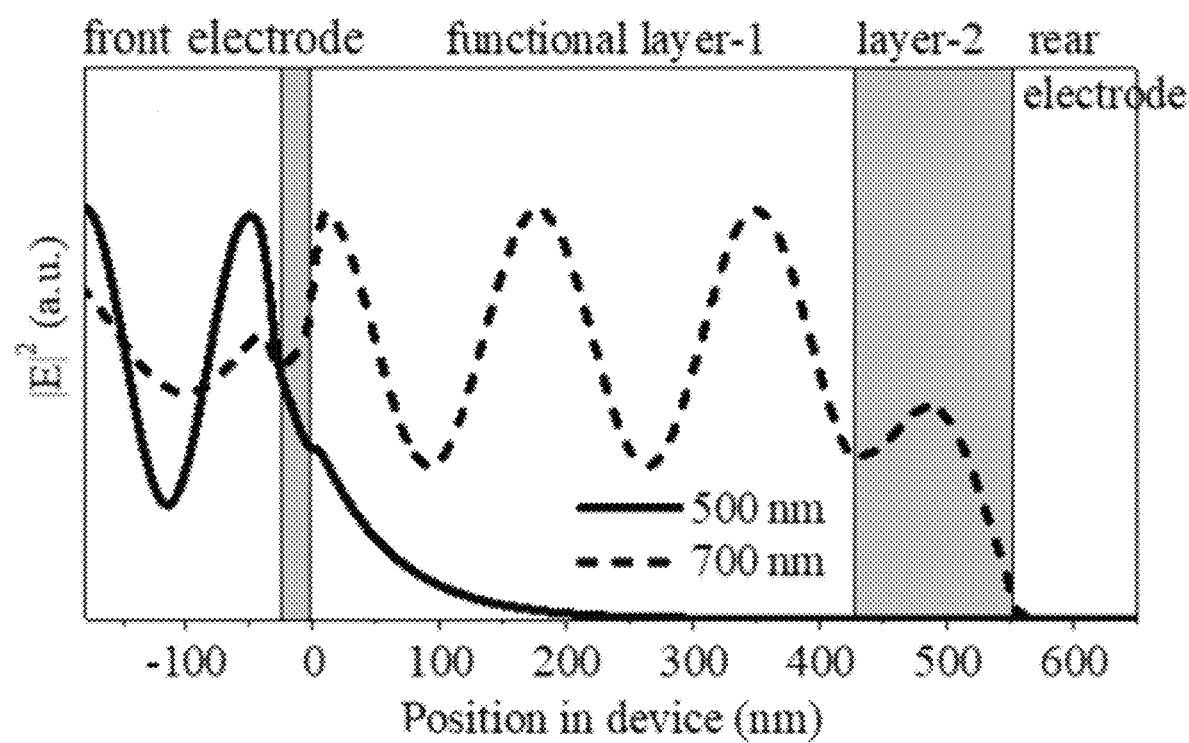
FIG. 4B shows the optical field distribution in the example #1 PD at two different wavelengths of 500 nm and 700 nm.
Figure 4C:
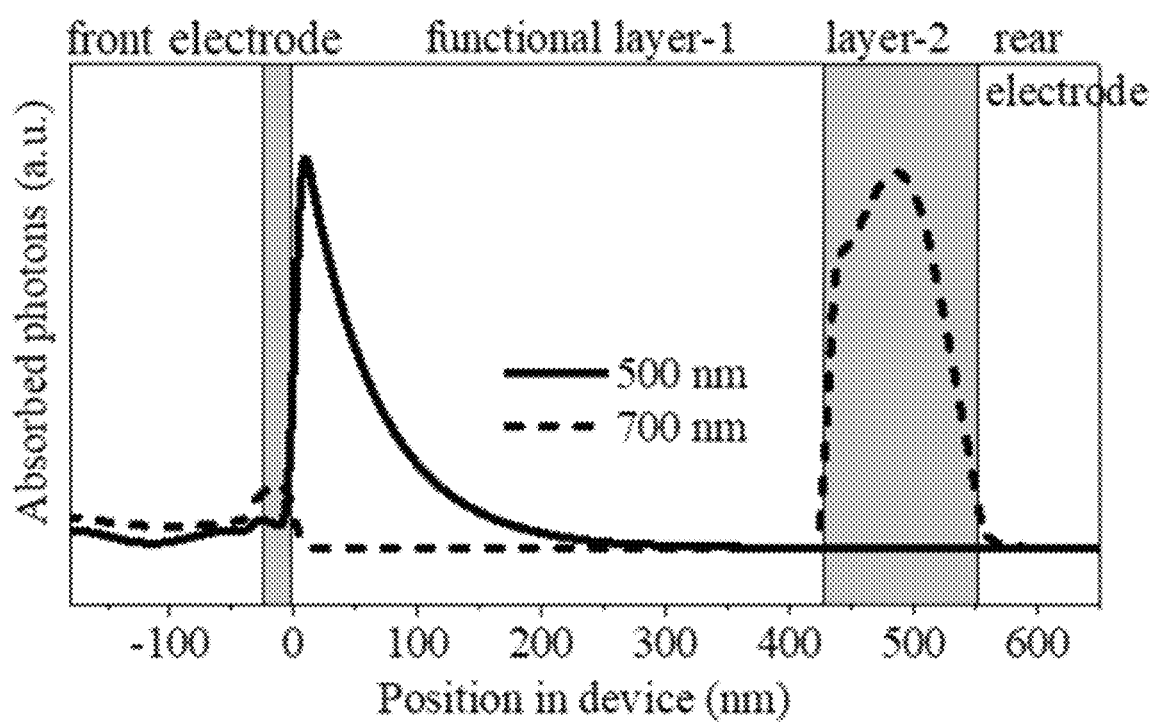
FIG. 4C shows the profile of the absorbed photons calculated for the example #1 PD at two different wavelengths of 500 nm and 700 nm.

One example of the filter-free tunable spectrum PD comprises a layer configuration of ITO/PEDOT:PSS (30 nm)/P3HT (430 nm)/PBDB-T:m-ITIC (120 nm)/Al (100 nm). In this case, the ITO is the anode, a 430 nm thick P3HT layer is the first functional layer, the binary PBDB-T:m-ITIC heterojunction layer serves as the second functional layer, and Al contact is the cathode. The schematic energy level diagram of the functional materials used in the example #1 PD is shown in FIG. 2. Upon photo excitation, NIR (longer-wavelength EM wave) induced charge carriers are generated in the PBDB-T:m-ITIC layer. The transmission spectrum of ITIC photoactive layer (second functional layer). It shows that the incident photons over the wavelength range from 600 to 800 nm are primary absorbed by the 120 nm thick PBDB-T:m-ITIC layer (second functional layer) in example #1 PD, as shown in FIG. 4A. To analyze the optical behavior of shorter wavelength light and longer wavelength light in the PD, the distribution of the optical field distribution and profile of absorbed photons generated by the shorter wavelength (e.g., 500 nm) light and longer wavelength (e.g., 700 nm) light inside the PD are plotted in FIGS. 4B and 4C. FIG. 4B shows that the shorter wavelength (500 nm) light is fully absorbed by the 430 nm thick P3HT depletion layer (first functional layer). It is clear that the longer wavelength (700 nm) light can pass through the depletion layer and be absorbed by the 120 nm thick PBDB-T:m-ITIC layer (second functional layer). The shorter wavelength (500 nm) photons are absorbed by the P3HT depletion layer (first functional layer), while the longer wavelength (700 nm) photons are absorbed by the PBDB-T:m-ITIC layer (second functional layer), as shown in FIG. 4C. The process includes depleting the shorter-wavelength EM wave, e.g., visible light, realizing the function of filter-free tunable spectral detection by absorbing the selected longer-wavelength EM waves, e.g., NIR light.

Figure 5:
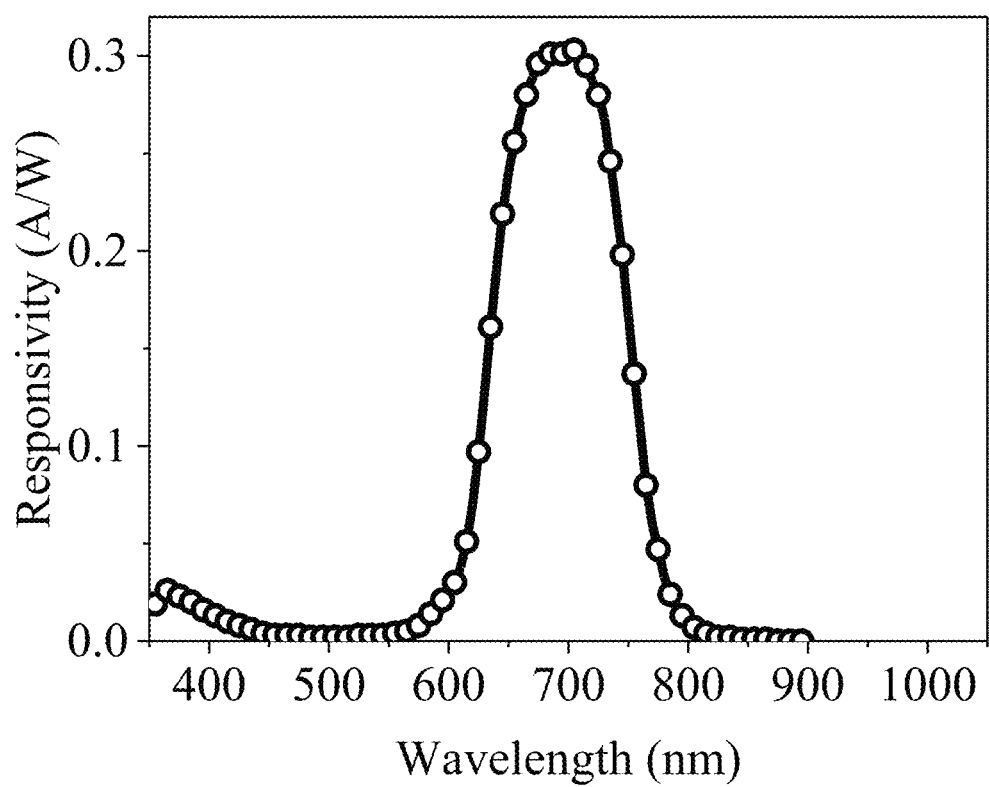
FIG. 5 shows the responsivity spectrum of example #1 PD operated without bias.
Figure 6A:
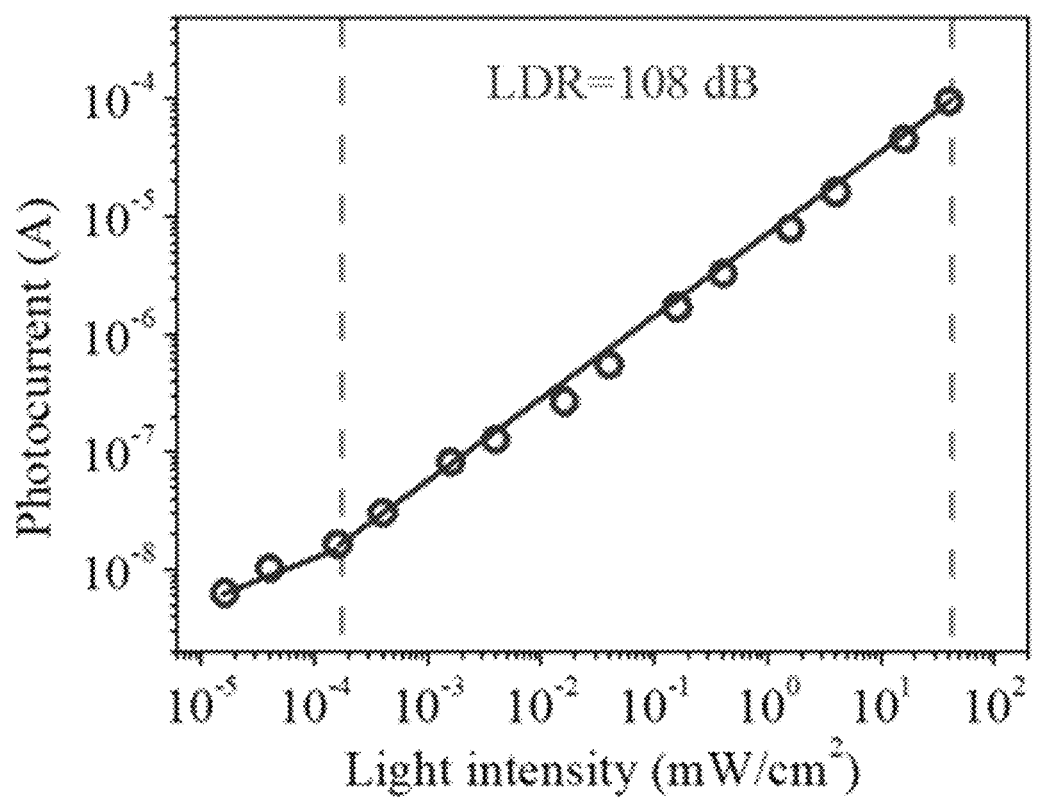
FIG. 6A shows the light intensity-dependent photocurrent measured for the example #1 PD operated without bias.
Figure 6B:
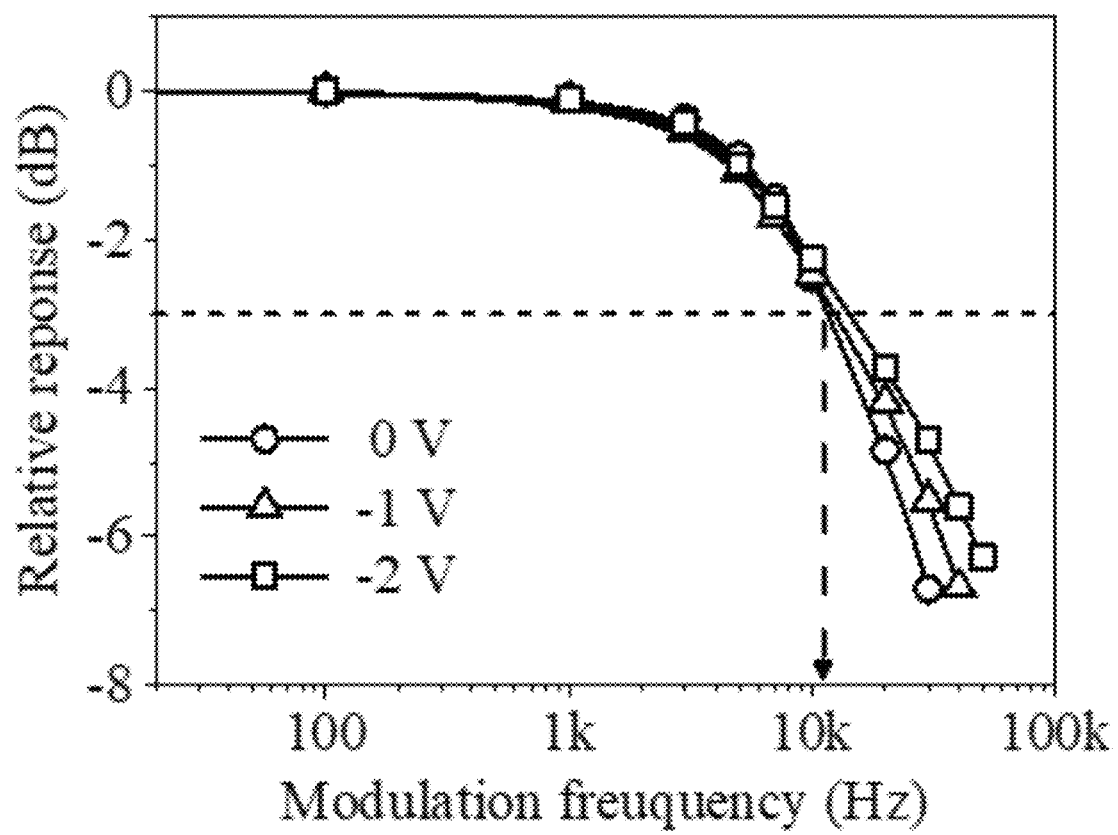
FIG. 6B shows the frequency modulated photo response measured using a 1000Ω resistor for the example #1 PD operated under different biases of 0 V, −1 V, and −2 V.

The responsivity spectrum measured for the example #1 PD is plotted in FIG. 5. Responsivity, defined as the ratio of photocurrent to the power of the incident light, can be calculated using the following expression:

$$R = \frac{I_{light} - I_{dark}}{P_{light}} \quad (1)$$

where $I_{light}$ and $I_{dark}$ are current measured for the PD in the presence and absence of light. $P_{light}$ refers to the power of the incident light. The filter-free narrowband (peaked at 700 nm) PD has a responsivity of 300 mA/W. The photo response shown in FIG. 5 is the result of the photocurrent generation due to the absorption of the second functional layer (PBDB-T:m-ITIC), as shown in FIG. 3. There is no photocurrent generated in the first functional layer (P3HT). The frequency response and linear dynamic range (LDR) of the PDs were also investigated. The results are shown in FIG. 6A. The LDR, defined as the linear light intensity dependence of the photocurrent in a PD, of the filter-free tunable spectrum PD in the presence of the NIR and visible light was analyzed. The LDR can be analyzed using the following equation:

$$LDR = 20 \times \log \frac{L_{upper}}{L_{lower}} \quad (2)$$

where $L_{upper}$ and $L_{lower}$ are the maximum and minimum limits of the intensity of incident light that the photocurrent of a PD follows a linear dependence on light intensity. The LDR, defined as the linear light intensity dependence of the photocurrent in a PD, measured for the P3HT/PBDB-T:m-ITIC PD is over 108 dB, as shown in FIG. 6A. The −3 dB frequency bandwidth, defined as the light source frequency at which the photoresponse reduces to 50% of the photoresponse under steady illumination, is shown in FIG. 6B. It shows that the −3 dB cutoff frequency measured for the PD using a 1000 Ω resistor, operated under different biases of 0 V, −1 V and −2 V, locates at 13 kHz indicating a bandwidth of over 10 kHz. It becomes clear that the filter-free tunable spectrum PDs disclosed in this patent application has a novel and state-of-art photodetection performance.

Example #2

Figure 7A:
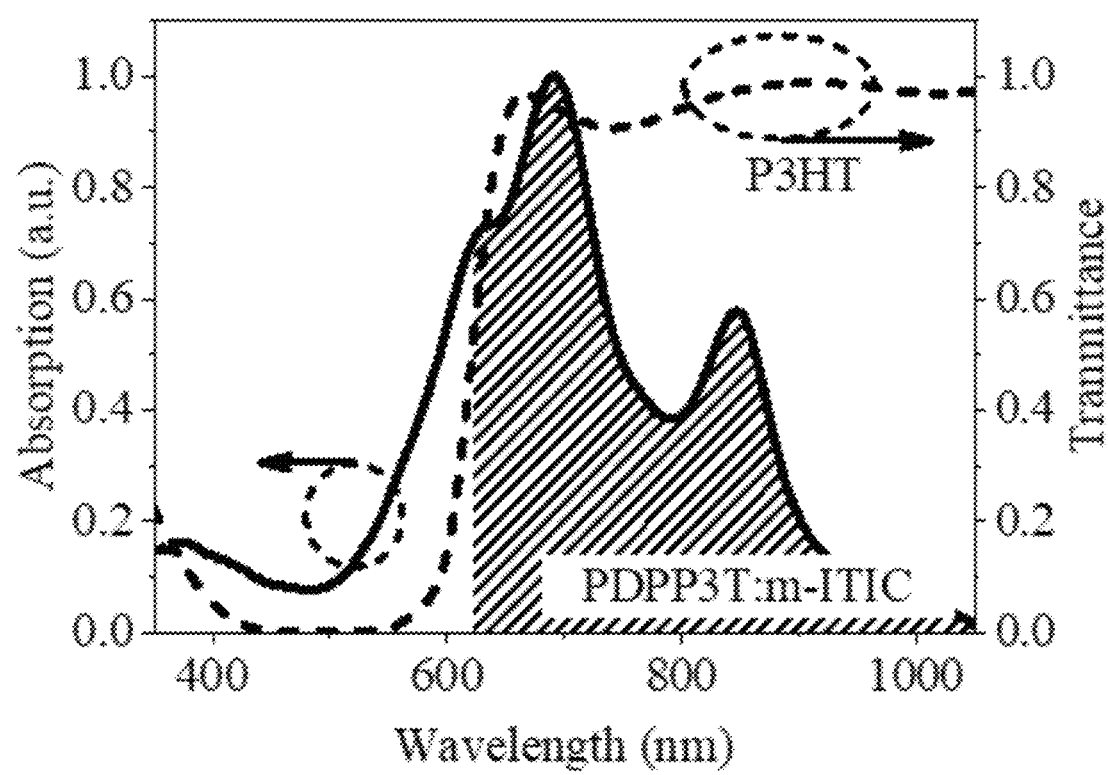
FIG. 7A shows the normalized absorption spectrum (solid curve) of an 80 nm thick PDPP3T:m-ITIC layer and transmission spectrum (dashed curve) of a 430 nm thick P3HT layer (dash curve). The shaded area indicates the wavelength range of the incident light that can be detected selectively by the PDPP3T:m-ITIC layer (second functional layer) in example #2 PD.
Figure 7B:
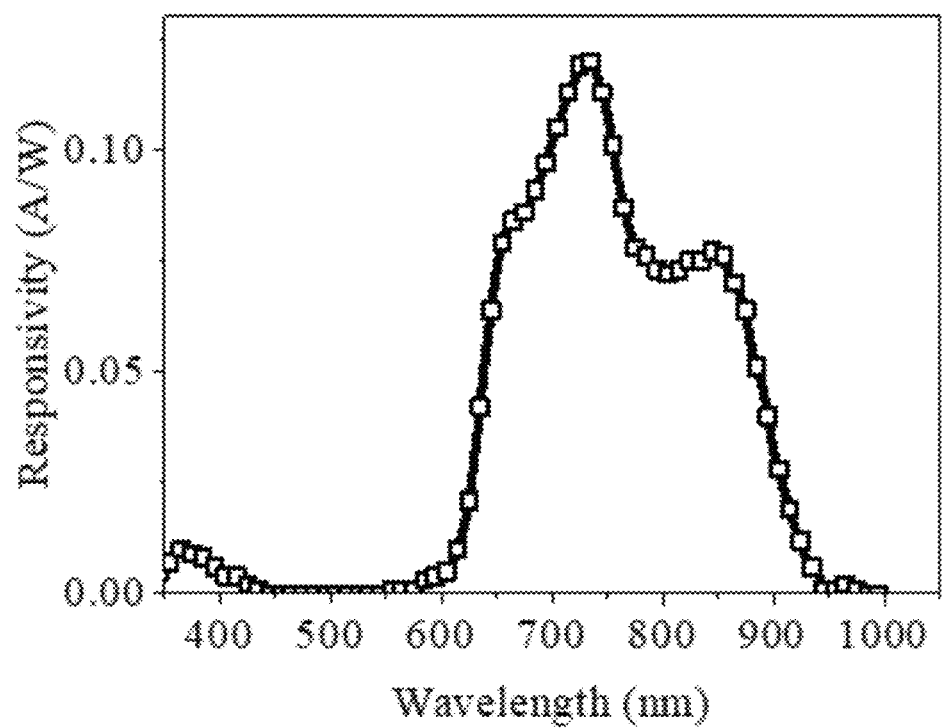
FIG. 7B shows the responsivity spectrum measured for example #2 PD operated under −2 V.

In example #2 PD, consisting a layer structure of P3HT (first functional layer) (430 nm)/PDPP3T:m-ITIC (second functional layer) (80 nm), has a filter-free tunable spectral photoresponse over the wavelength range from 600 to 950 nm. The absorption of an 80 nm thick PDPP3T:m-ITIC layer is shown in FIG. 7A. Due to the absorption of shorter wavelength light by the 430 nm thick P3HT layer, the photo-carriers in the PDPP3T:m-ITIC layer are generated by the longer-wavelength light over the wavelength range from 600 to 950 nm. The responsivity of example #2 PD over the wavelength range from 600 to 950 nm, with a peak responsivity of 120 mA/W at 725 nm, is plotted in FIG. 7B. The photo response shown in FIG. 7B is the result of the photocurrent generation due to the absorption of the second functional layer (PDPP3T:m-ITIC), as shown in FIG. 7A. There is no photocurrent generated in the first functional layer (P3HT). Compared to the photoresponse properties of example #1 PD, example #2 PD has a broader NIR photoresponse wavelength range from 800 to 950 nm. This demonstrates that the wavelength range of the spectral response in the PD disclosed in the patent application can be adjusted by choosing the combination of the difference in wavelength between the absorption edge of the second functional layer and the transmission cut-off of the first functional layer.

Example #3

Figure 8A:
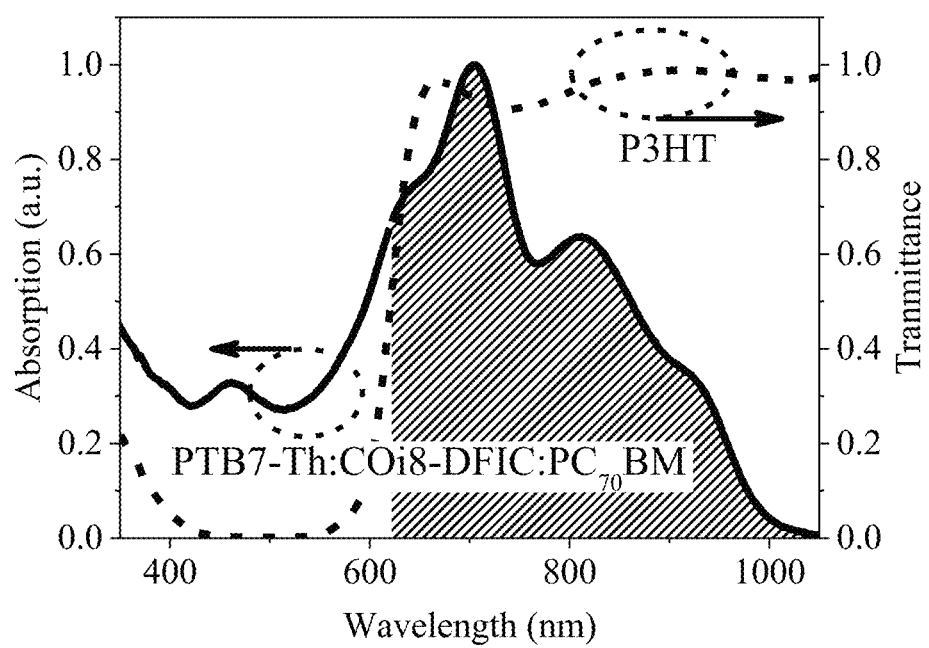
FIG. 8A shows the normalized absorption spectrum (solid curve) of a 100 nm thick ternary PTB7-Th:CO$_i$8DFIC:PC$_{70}$BM layer (second functional layer) and transmission spectrum (dashed curve) of a 430 nm thick P3HT layer (first functional layer) in example #3 PD. The shaded area indicates the wavelength range of the incident light that can be detected selectively by the PTB7-Th:CO$_i$8DFIC:PC$_{70}$BM layer (second functional layer) in example #3 PD.
Figure 8B:
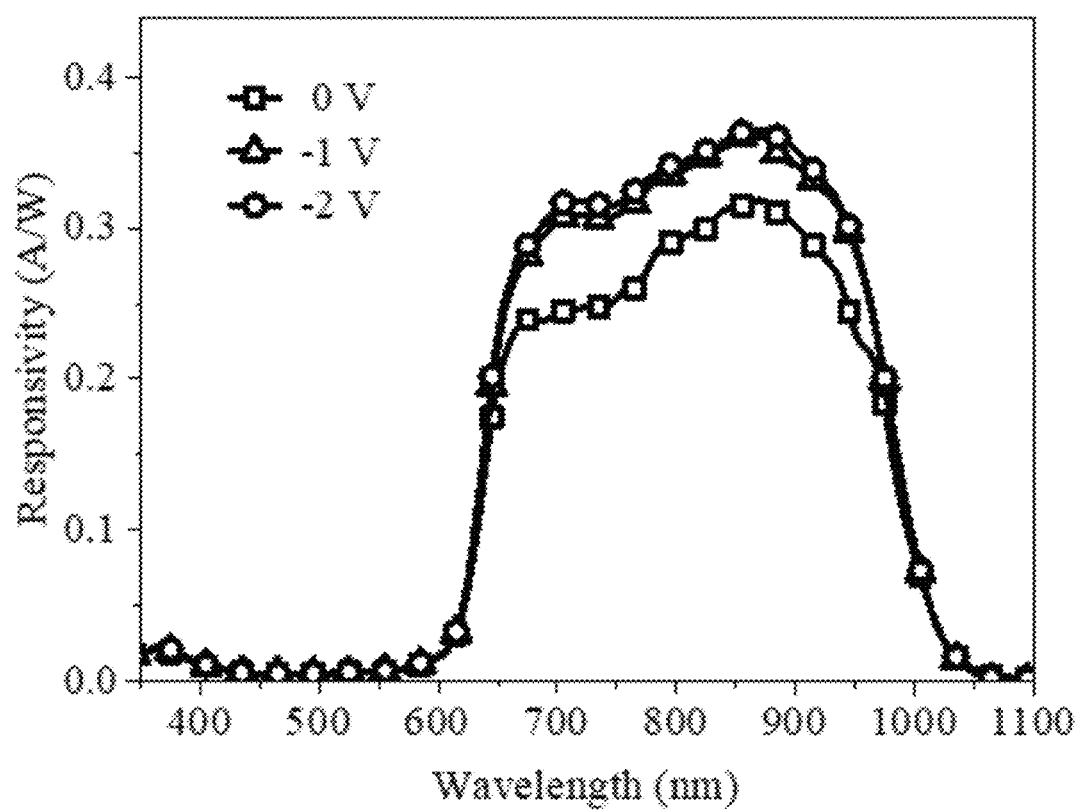
FIG. 8B shows the responsivity spectrum measured for example #3 PD operated under different biases of 0 V, −1V, −2 V.

Example #3 PD has a layer configuration of P3HT (first functional layer) (430 nm)/PTB7-Th:CO$_i$8DFIC:PC$_{70}$BM (second functional layer) (100 nm). The 100 nm thick PTB7-Th:CO$_i$8DFIC:PC$_{70}$BM layer has a longer-wavelength, NIR, absorption edge at 1050 nm, which is very suitable for the NIR photodetection. The transmission spectrum of a 430 nm thick P3HT (first functional layer) and the absorption spectrum of a PTB7-Th:CO$_i$8DFIC:PC$_{70}$BM layer are shown in FIG. 8A. The PTB7-Th:CO$_i$8DFIC:PC$_{70}$BM layer has two absorption peaks at 700 nm and 810 nm. The responsivity measured for the example #3 PD, operated under different biases of 0 V, −1 V and −2 V, demonstrating a wavelength selective response over the wavelength range from 600 to 1050 nm is shown in FIG. 8B. The peak responsivity of 0.36 A/W at 870 nm was obtained for example #3 PD. The photo response shown in FIG. 8B is the result of the ohotocurrent generation due to the absorption of the second functional layer (PTB7-Th:CO$_i$8DFIC:PC$_{70}$BM), as shown in FIG. 8A. There is no photocurrent gnerated in the first functional layer (P3HT).

The example #3 PD reveals the capability and novel idea of the filter-free tunable spectrum PD disclosed in the present patent application. The rapid progresses made in the development of organic semiconducting materials offer an attractive option and a variety of material choices for application in filter-free tunable spectrum PDs.

Example #4

Figure 9A:
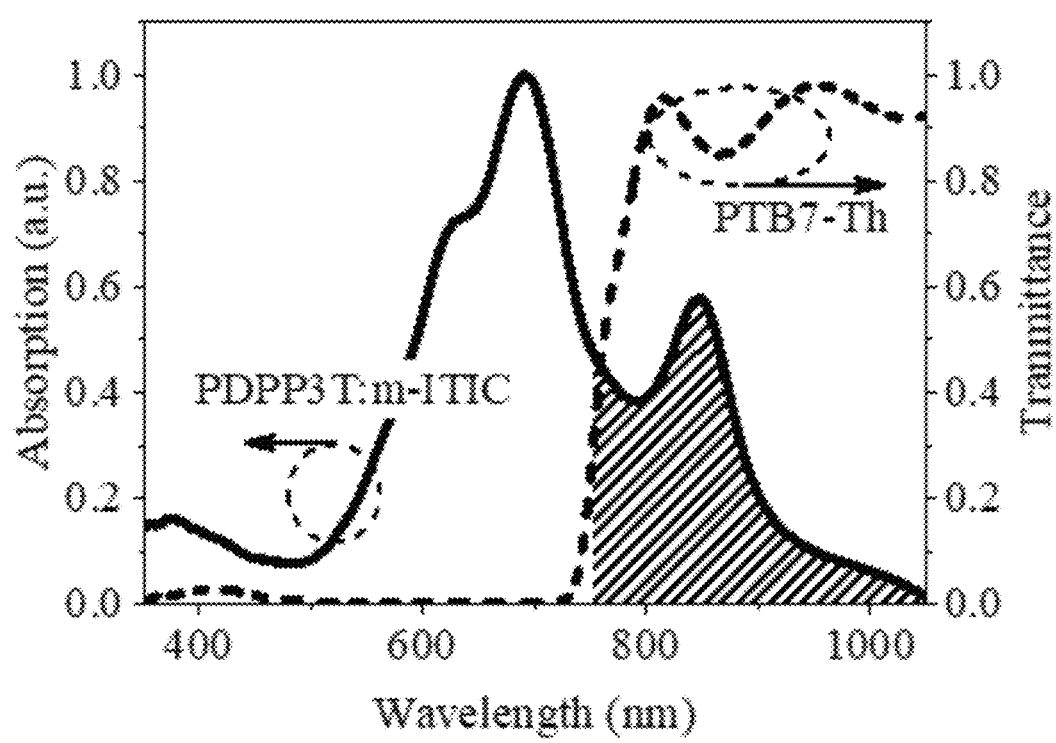
FIG. 9A shows the absorption spectrum (solid curve) of an 80 nm thick PDPP3T:m-ITIC layer (second functional layer) and transmission spectrum (dashed curve) of an 800 nm thick PTB7-Th layer (first functional layer) in example #4 PD. The shaded area indicates the wavelength range of the incident light that can be detected selectively by the PDPP3T:m-ITIC layer (second functional layer) in example #4 PD.
Figure 9B:
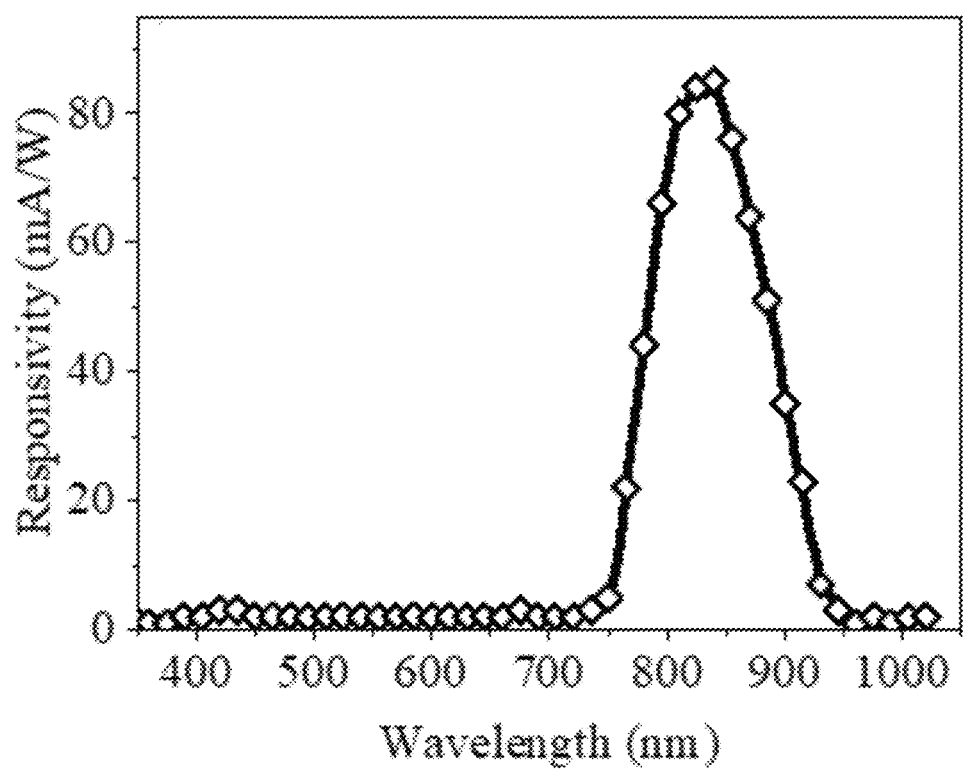
FIG. 9B shows the responsivity spectrum measured for example #4 PD operated under −2 V.

Example #4 PD has a layer stack of PTB7-Th (first functional layer) (800 nm)/PDPP3T:m-ITIC (second functional layer) (80 nm). The transmission spectrum of an 800 nm thick PTB7-Th layer (first functional layer) with a transmission cut-off at 750 nm, and the absorption spectrum of an 80 nm thick PDPP3T:m-ITIC layer (second functional layer), with an absorption edge at 950 nm, are presented in FIG. 9A. PD with a bi-layer PTB7-Th (first functional layer)/PDPP3T:m-ITIC (second functional layer) structure enables a filter-free NIR photodetection over the selected wavelength range from 750 to 950 nm, as illustrated by the shaded area in FIG. 9A. The responsivity of example #4 PD operated under −2 V, over the well-defined NIR wavelength range, with a peak located at 830 nm, is plotted in FIG. 9B. The photo response shown in FIG. 9B is the result of the photocurrent generation due to the absorption of the second functional layer (PDPP3T:m-ITIC), as shown in FIG. 9A. There is no photocurrent generated in the first functional layer (PTB7-Th).

Example #5

Figure 10A:
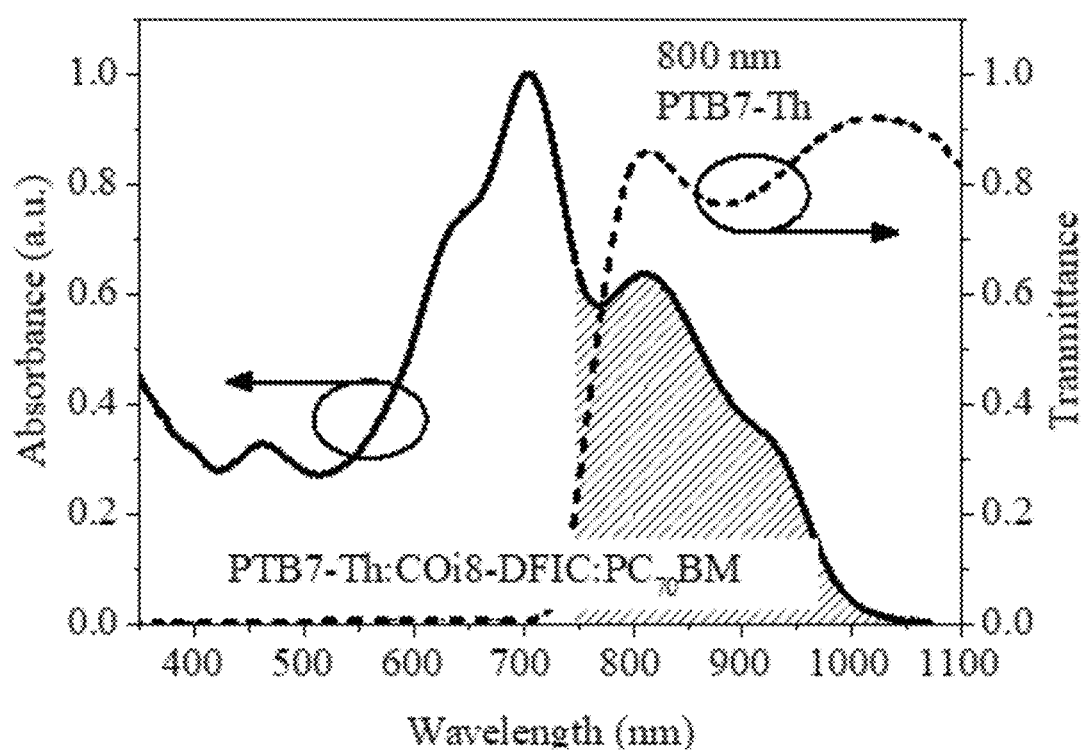
FIG. 10A shows the absorption spectrum (solid curve) of a 100 nm thick PTB7-Th:CO$_i$8DFIC:PC$_{70}$BM layer (second functional layer) and transmission spectrum (dash curve) of an 800 nm thick PTB7-Th layer (first functional layer) used in example #5 PD. The shaded area indicates the wavelength range of the incident light that can be detected selectively by the PTB7-Th:CO$_i$8DFIC:PC$_{70}$BM layer (second functional layer) in example #5 PD.
Figure 10B:
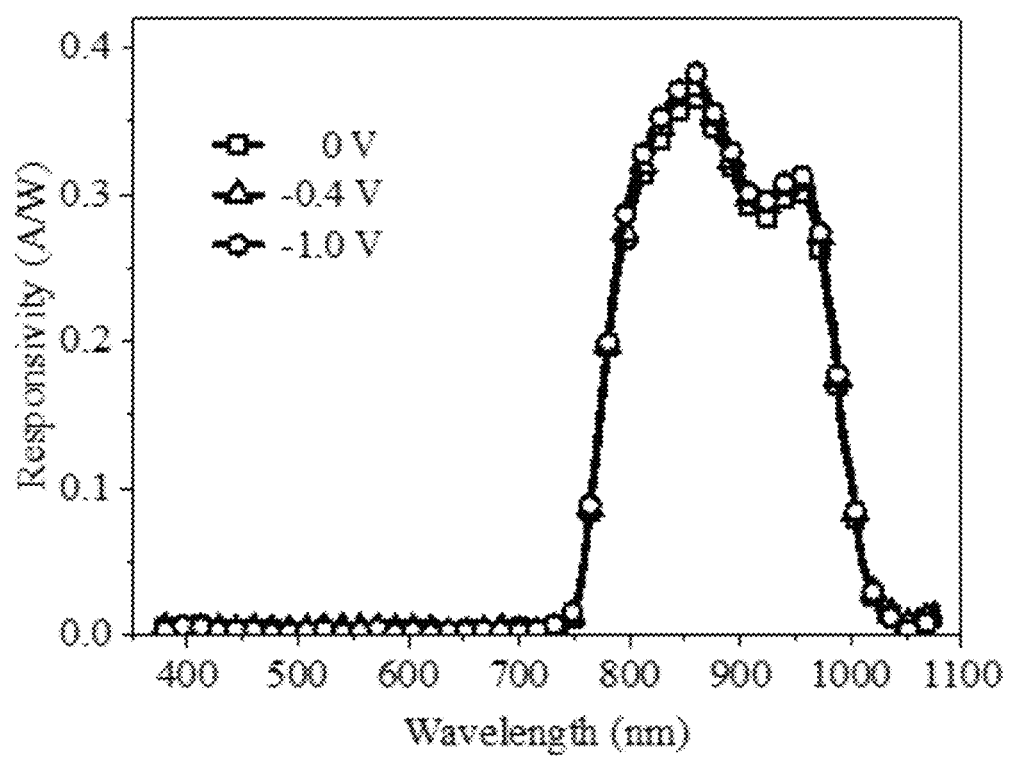
FIG. 10B shows the responsivity spectrum measured for example #5 PD operated under different biases of 0V, −1 V, −2 V.
Figure 10C:
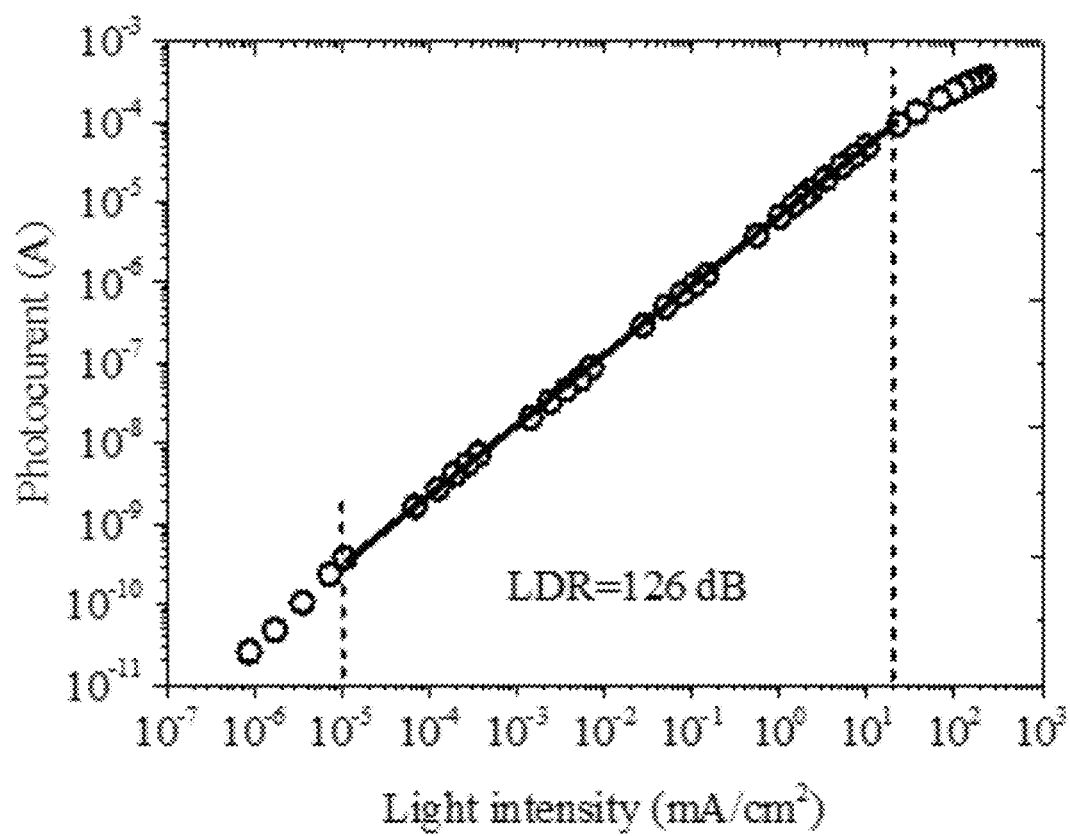
FIG. 10C shows the photocurrent measured for the example #5 PD operated without bias, under different light intensities.
Figure 10D:
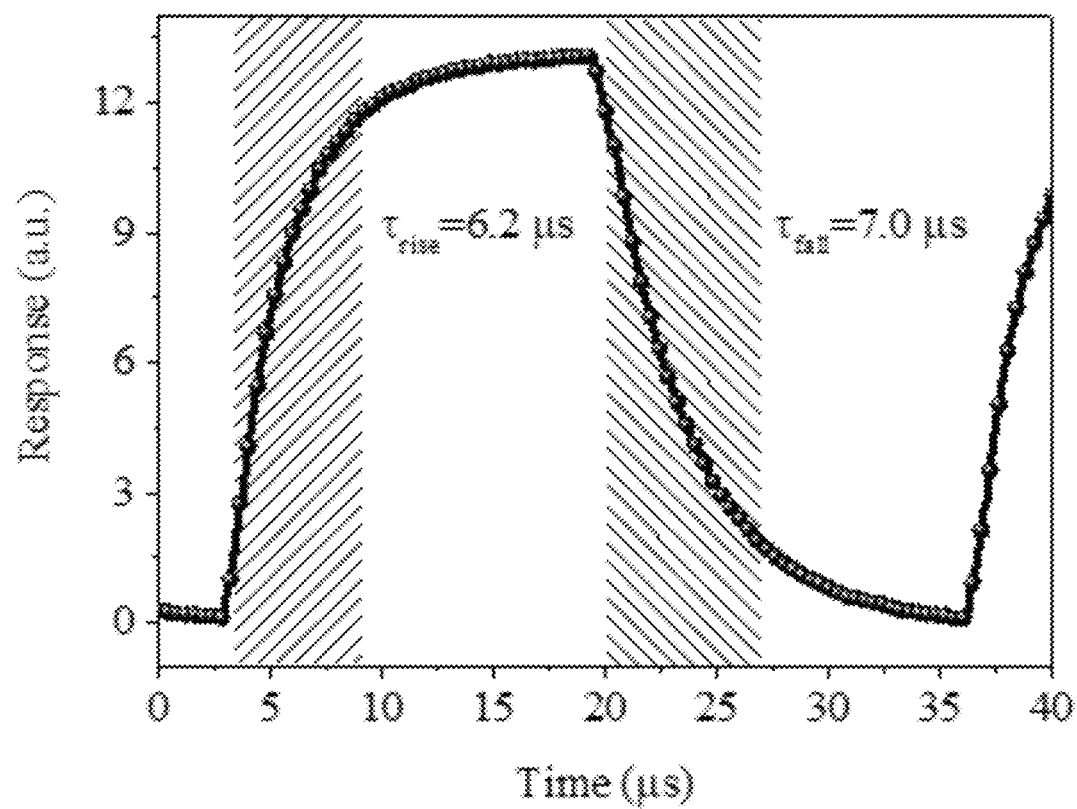
FIG. 10D shows the transient response measured for the example #5 PD operated without bias.

Example #5 PD has a combination of the PTB7-Th layer (first functional layer) and the PTB7-Th:CO$_t$8DFIC:PC$_{70}$BM layer (second functional layer): ITO/PEDOT:PSS (30 nm)/PTB7-Th (800 nm)/PTB7-Th:CO$_t$8DFIC:PC$_{70}$BM (100 nm)/ZnO (10 nm)/Al (100 nm). The absorption of the PTB7-Th:CO$_t$8DFIC:PC$_{70}$BM (second functional layer) and the transmission spectrum of PTB7-Th (first functional layer) are plotted in FIG. 10A. The example #5 PD, operated under different biases of 0V, −0.4 V, −1 V, has a responsivity of >0.3 A/W over the wavelength range from 800 to 980 nm, as shown in FIG. 10B. The photo response shown in FIG. 10B is the result of the photocurrent generation due to the absorption of the second functional layer (PTB7-Th:CO$_t$8DFIC:PC$_{70}$BM), as shown in FIG. 10A. There is no photocurrent generated in the first functional layer (PTB7-Th). Compared to the photoresponse of the example #3 PD, example #5 PD has an efficient photoresponse over a selected wavelength range from 750 to 1050 nm. The results demonstrate the device design freedom for tuning or adjusting the wavelength range for the filter-free tunable spectral detection, realized through an appropriate combination of the first functional layer and the second functional layer materials. The LDR measured for the example #5 PD is shown in FIG. 10C, indicating an LDR of 126 dB. The transient response measured for the example #5 PD is shown in FIG. 10D, indicating a rise time of 6.2 μs and a fall time of 7.0 μs.

Example #6

Figure 11A:
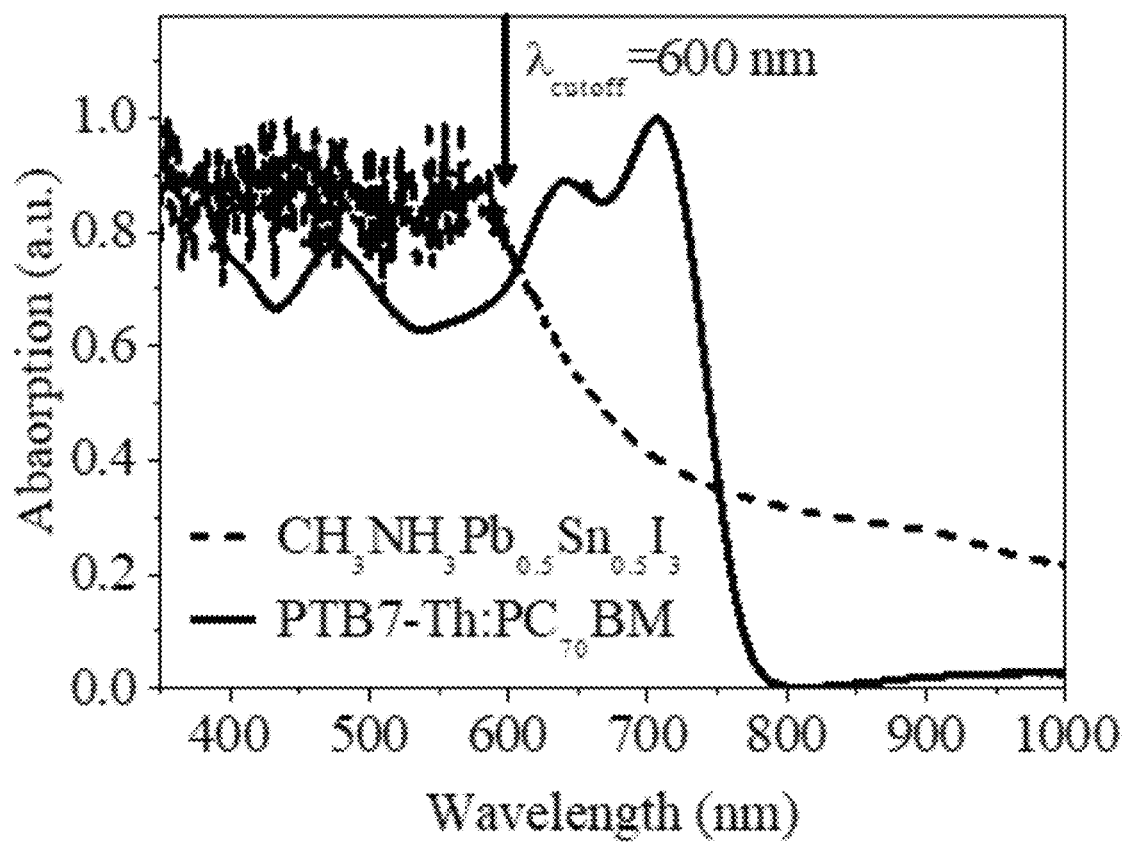
FIG. 11A shows the absorption spectrum (dashed curve) of a 900 nm thick $CH_3NH_3Pb_{0.5}Sn_{0.5}I_3$ layer (first functional layer) showing an absorption edge at a wavelength around 600 nm, and absorption spectrum (solid curve) of a 200 nm thick PTB7-Th:PC$_{70}$BM layer (second functional layer) used in example #6 PD. The wavelength range of the incident light, that can be detected selectively by the PTB7-Th:PC$_{70}$BM layer (second functional layer) used in example #6 PD, is determined by the difference in the absorption edge of the first functional layer and that of the second functional layer.
Figure 11B:
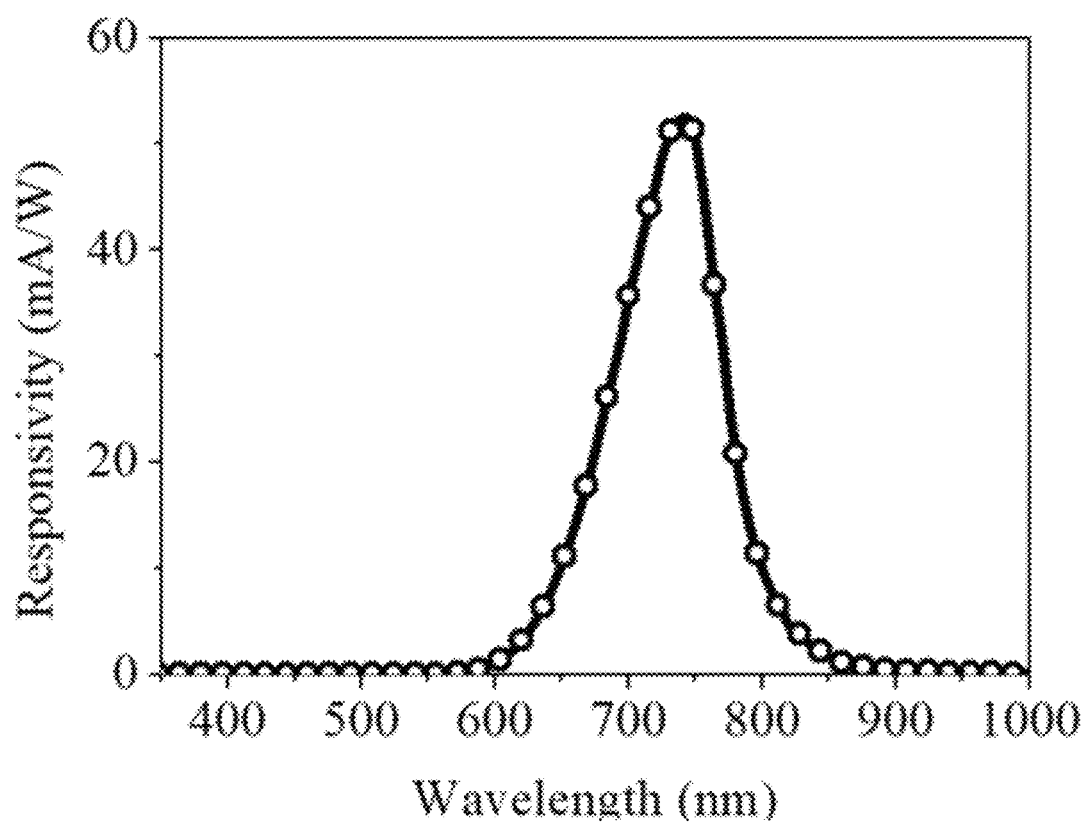
FIG. 11B shows the responsivity spectrum measured for example #6 PD operated without bias.

Example #6 PD comprises a layer configuration of CH$_3$NH$_3$Pb$_{0.5}$Sn$_{0.5}$I$_3$ (first functional layer) (900 nm)/PTB7-Th:PC$_{70}$BM (second functional layer) (200 nm). The first electrode is a PEDOT:PSS-modified ITO anode to enhance the hole extraction, and the second electrode is a ZnO-modified Ag to facilitate the electron extraction. The absorption spectrum of a 900 nm thick CH$_3$NH$_3$Pb$_{0.5}$Sn$_{0.5}$I$_3$ layer (first functional layer), with an absorption edge at a shorter wavelength of 600 nm, and the absorption spectrum of a 200 nm thick PTB7-Th:PC$_{70}$BM (second functional layer), with an absorption edge at a longer wavelength of 850 nm, are shown in FIG. 11A. The example #6 PD with a selective photoresponse wavelength range is determined by the difference in wavelengths between the absorption edge of a 900 nm thick CH$_3$NH$_3$Pb$_{0.5}$Sn$_{0.5}$I$_3$ layer (first functional layer) and that of a 200 nm thick PTB7-Th:PC$_{70}$BM (second functional layer). The responsivity spectrum with a FWHM of 90 nm, measured for the example #6 PD without bias, is shown in FIG. 11B. A peak responsivity of 90 mA/W at 740 nm was obtained for example #6 PD. The photo response shown in FIG. 11B is the result of the photocurrent generation due to the absorption of the second functional layer (PTB7-Th:PC$_{70}$BM), as shown in FIG. 11A. There is no photocurrent generated in the first functional layer (CH$_3$NH$_3$Pb$_{0.5}$Sn$_{0.5}$I$_3$). The high responsivity measured for example #6 PD, without bias, also demonstrates the capability of the filter-free tunable spectrum PD that can be operated in a self-powered mode, an important property of the NIR PD in practical applications.

Example #7

Figure 12A:
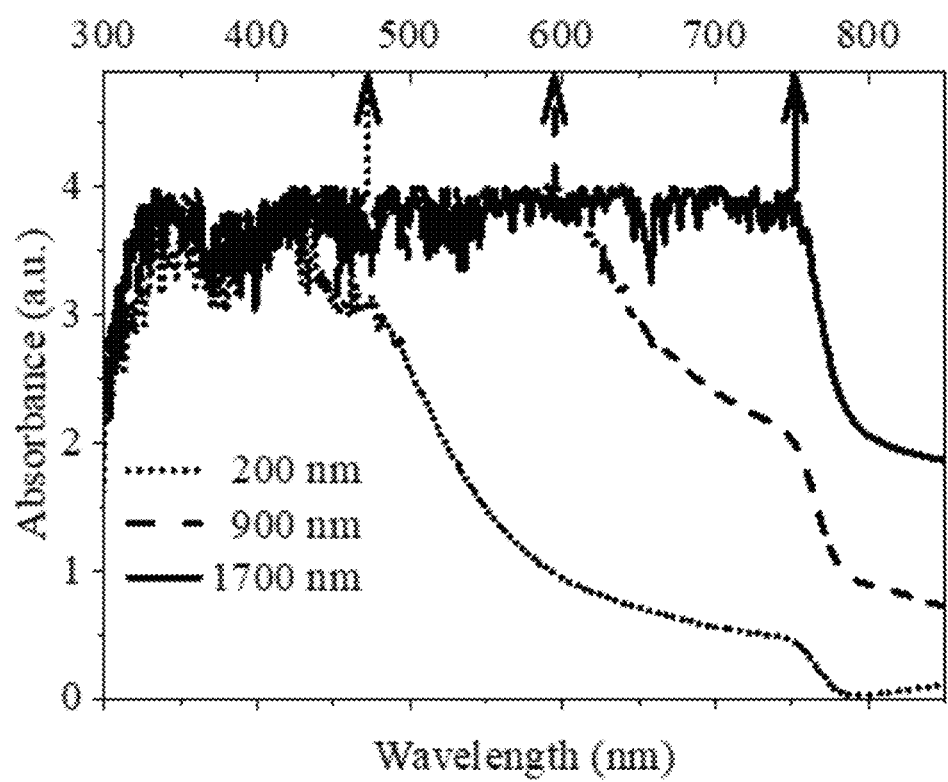
FIG. 12A shows the absorption spectra measured for the first functional layer with different $CH_3NH_3PbI_3$ layer thicknesses of 200 nm, 900 nm, 1700 nm, showing the absorption edge wavelengths at 470 nm, 600 nm and 750 nm, respectively. The wavelength range of the incident light, that can be detected selectively by the 200 nm thick PTB7-Th:PC$_{70}$BM layer (second functional layer) used in example #7 PD, is determined by the difference in wavelength of the absorption edge of the $CH_3NH_3PbI_3$ layer (first functional layer) and that of the PTB7-Th:PC$_{70}$BM layer (second functional layer).
Figure 12B:
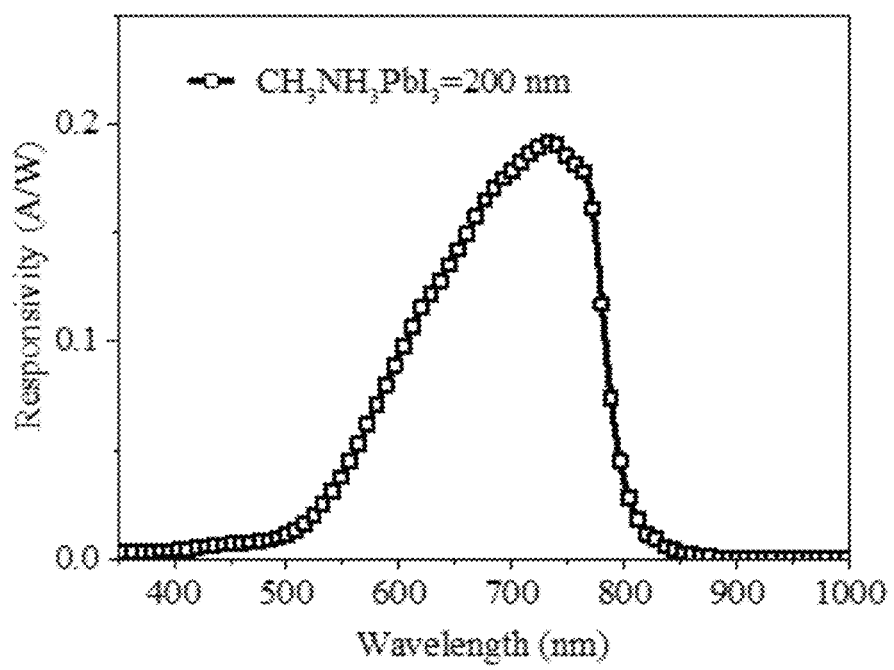
FIG. 12B shows the responsivity spectrum measured for the $CH_3NH_3PbI_3$/PTB7-Th:PC$_{70}$BM photodetector with a 200 nm thick $CH_3NH_3PbI_3$ layer.
Figure 12C:
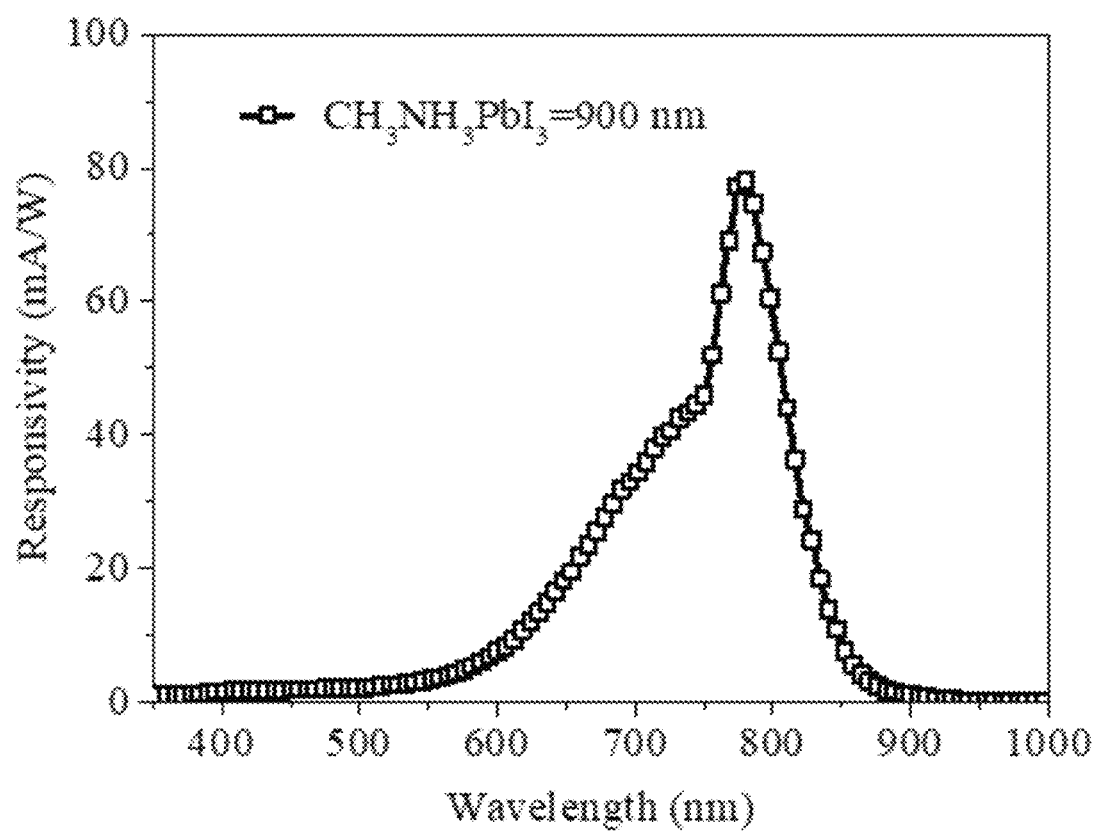
FIG. 12C shows the responsivity spectrum measured for the $CH_3NH_3PbI_3$/PTB7-Th:PC$_{70}$BM photodetector with a 900 nm thick $CH_3NH_3PbI_3$ layer.
Figure 12D:
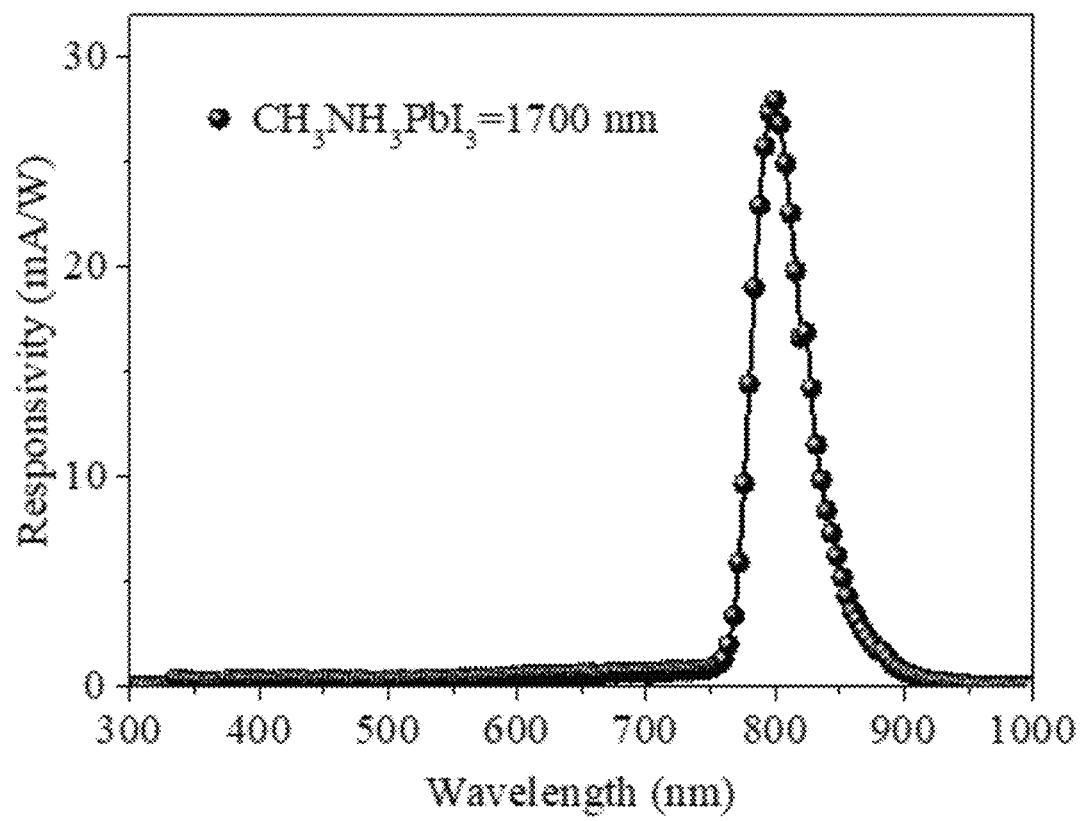
FIG. 12D shows the responsivity spectrum measured for the example #7 PD, with a 1700 nm thick $CH_3NH_3PbI_3$ layer, operated without bias.

Example #7 PD has a layer combination of a 1700 nm thick CH$_3$NH$_3$PbI$_3$ layer (first functional layer) and a 200 nm thick PTB7-Th:PC$_{70}$BM (second functional layer). The absorption spectrum measured for a 1700 nm thick CH$_3$NH$_3$PbI$_3$ layer (first functional layer) has a sharp absorption edge at 750 nm, as shown in FIG. 12A. The absorption spectra measured for the CH$_3$NH$_3$PbI$_3$ layers with different layer thicknesses of 200 nm and 900 nm are plotted in FIG. 12A. The wavelength range of the incident light that can be detected selectively by the PTB7-Th:PC$_{70}$BM layer (second functional layer) used in example #7 PD is determined by the difference in wavelength between the absorption edge of the CH$_3$NH$_3$PbI$_3$ layer (first functional layer) and that of the 200 nm thick PTB7-Th:PC$_{70}$BM layer (second functional layer). The responsivity spectra measured for the CH$_3$NH$_3$PbI$_3$/PTB7-Th:PC$_{70}$BM type photodetectors having a 200 nm thick and a 900 nm thick CH$_3$NH$_3$PbI$_3$ layers are shown in FIG. 12B and FIG. 12C, respectively. The example #7 PD has a narrowband photoresponse with a FWHM of 50 nm and a peak responsivity of 28 mA/W at 800 nm, measured for the PD operated without bias as shown in FIG. 12D. The photo response shown in FIG. 12 is the result of the photocurrent generation due to the absorption of the second functional layer (PTB7-Th:PC$_{70}$BM).

The FWHM of the responsivity spectrum of the PD disclosed in this patent application can be adjusted using the desired material combination in the device structure, e.g., forming a relatively broadband responsivity spectrum with a FWHM of ~340 nm in example #3 PD, or a narrowband responsivity spectrum with a FWHM of ~50 nm in example #7 PD.

Example #8

Figure 13:
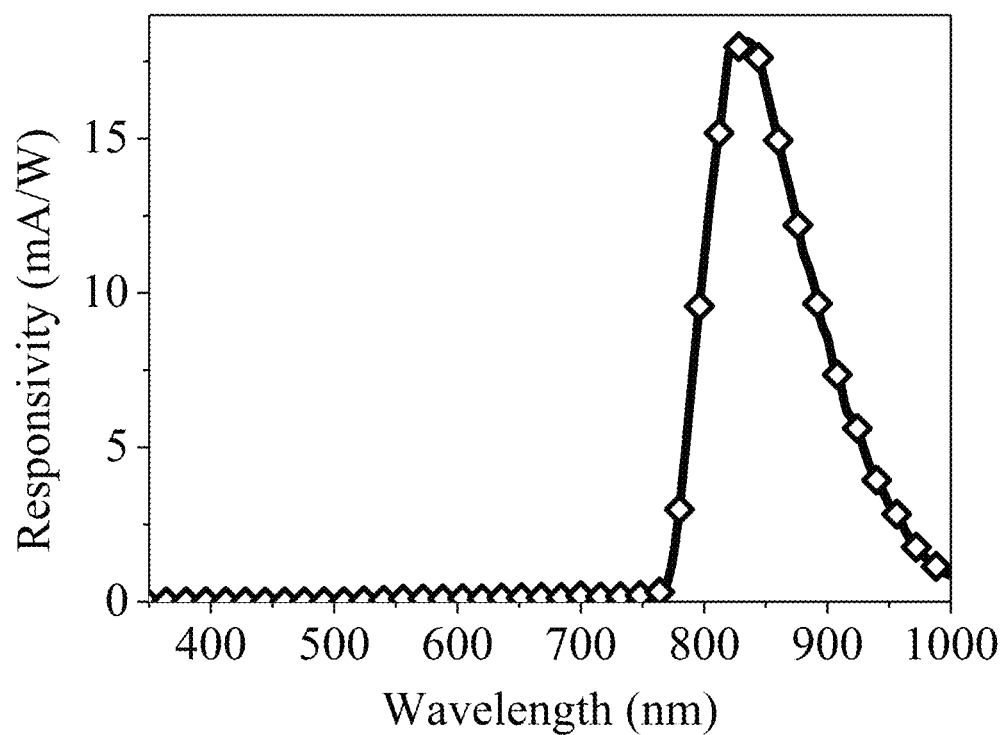
FIG. 13 shows the responsivity spectrum measured for the example #8 PD without bias. The example #8 PD has a bi-layer configuration of $CH_3NH_3PbI_3$ (first functional layer) (1700 nm)/PCPDTBT:PC$_{70}$BM (second functional layer) (120 nm).

Example #8 PD comprises a layer configuration of CH$_3$NH$_3$PbI$_3$ (first functional layer) (1700 nm)/PCPDTBT:PC$_{70}$BM (second functional layer) (120 nm). Responsivity spectrum measured for the example #8 PD, without bias, is shown in FIG. 13, demonstrating a visible light-blind NIR photoresponsivity over the wavelength range from 750 to 1000 nm, with a peak at 830 nm and a FWHM of the responsivity spectrum of 100 nm.

Figure 14A:
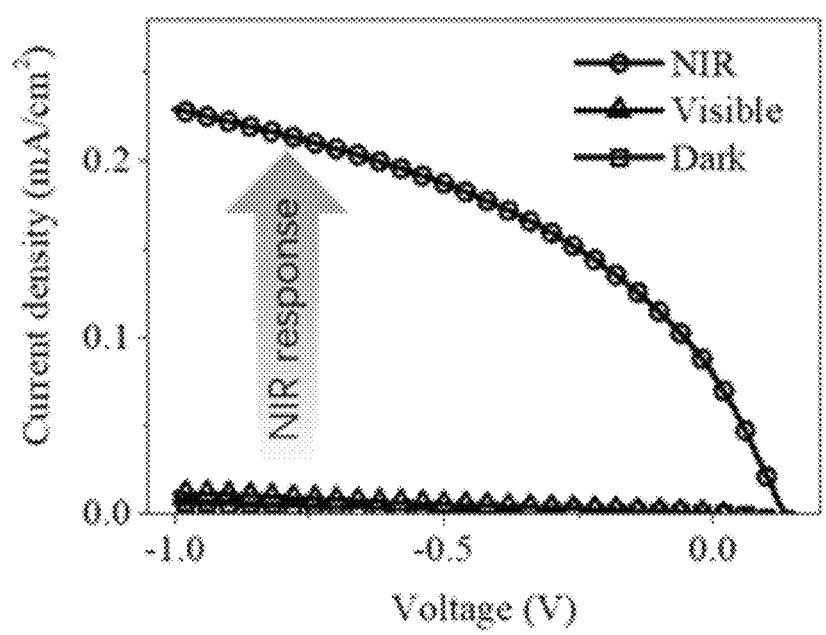
FIG. 14A shows the current density-voltage characteristics measured for the example #7 PD in dark, in the presence of visible light (14 mW/cm$^2$) and NIR light (14 mW/cm$^2$).
Figure 14B:
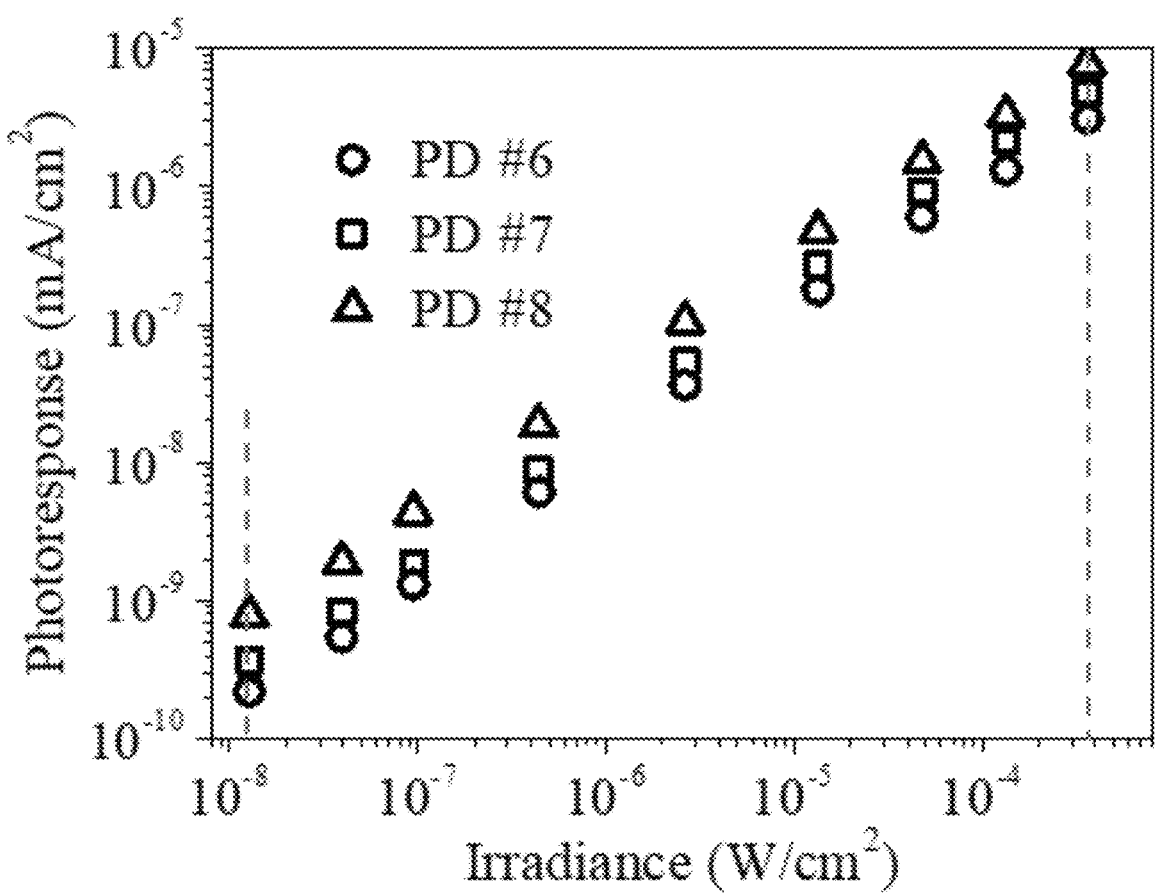
FIG. 14B shows the LDR characteristics measured for the examples #6, #7, and #8 PDs, indicating an LDR of 88 dB.

The current density-voltage characteristics measured for the example #7 PD is shown in FIG. 14A. It shows that the device current measured under visible light is similar to the one that is measured in the dark, indicating that the example #7 PD is insensitive to the visible light. When the photodetector is operated in the presence of NIR light, the high NIR photoresponse is observed. The frequency bandwidth of the visible light blind NIR narrowband examples #6, #7 and #8 PDs were investigated as shown in FIG. 14B. The photoresponse of the PDs as a function of the intensity of the NIR light source was also analyzed over the NIR light power range from $10^{-8}$ to $10^{-3}$ mW/cm$^2$ with an LDR of over 88 dB, as shown in FIG. 14B.

INDUSTRIAL APPLICABILITY

The present disclosure relates the high-performance filter-free tunable spectrum PDs with a configuration of first electrode/first functional layer/second functional layer/second electrode. The filter-free tunable spectrum PDs can be used for applications in thermal imaging, thermal therapy, night-vision, Li-Fi, light communication, optical communication, environmental detection, agricultural, wellness, food, bioimage, automotive and security monitoring.

The invention claimed is:
1. A filter-free tunable spectrum photodetector comprising a layered structure of at least two electrodes and at least two functional layers, wherein a first functional layer of the at least two functional layers comprises a shorter-wavelength electromagnetic wave depletion layer within a first wavelength range of 10 nm to 1000 μm, wherein the first functional layer absorbs electromagnetic radiation in the first wavelength range without generating photocurrent and is transparent to electromagnetic radiation in a longer-wavelength second wavelength range of 10 nm to 1000 μm, and wherein a second functional layer of the at least two functional layers comprises a longer-wavelength electromagnetic wave absorbing layer within the second wavelength range for generating photocurrent upon absorption of the longer-wavelength electromagnetic waves and wherein filter-free tunable spectral detection of the photodetector occurs by adjusting a selected spectral response window within a wavelength range determined by a difference in wavelength between a transmission cut-off wavelength of the first functional layer and an absorbing edge of the second functional layer.

2. The photodetector of claim 1, wherein the shorter-wavelength electromagnetic wave has a wavelength range from 10 nm to 1000 μm.

3. The photodetector of claim 1, wherein the longer-wavelength electromagnetic wave has a wavelength range from 10 nm to 1000 μm.

4. The photodetector according to claim 1 wherein the first functional layer and the second functional layer are made of materials comprising organic, polymer, perovskite, colloidal quantum dots, and inorganic compounds, or any combination thereof.

5. The photodetector according to claim 4 wherein the short-wavelength electromagnetic wave depletion layer is selected from a P3HT layer, a PTB7-Th layer, a $CH_3NH_3Pb_{0.5}Sn_{0.5}I_3$ perovskite layer or a $CH_3NH_3PbI_3$ perovskite layer.

6. The photodetector according to claim 4 wherein the longer-wavelength electromagnetic wave absorbing layer is selected from a PBDB-T:m-ITIC blended layer, a PDPP3T:m-ITIC blended layer, PTB7-Th:$CO_i8DFIC$:$PC_{70}BM$ blended layer, a PTB7-Th:$PC_{70}BM$ blended layer or a PCPDTBT:$PC_{70}BM$ blended layer.

7. The photodetector according to claim 1 wherein the first functional layer and/or the second functional layer is/are selected from at least one of a functional layer, a stack of blended layers, or a combination of functional layers and blended layers.

8. The photodetector according to claim 1 is prepared using solution fabrication, vacuum evaporation, printing processes, nanoimprinting, transfer processes, or any combination thereof.

9. The photodetector according to claim 1, wherein the first functional layer is a charge transporting layer.

10. The photodetector according to claim 1, wherein the second functional layer is an absorption layer absorbing shorter-wavelength electromagnetic waves.

11. The photodetector according to claim 1, wherein the second functional layer is an absorption layer absorbing longer-wavelength electromagnetic waves.

12. The photodetector according to claim 1, wherein a first electrode of the at least two electrodes which is more proximal to incident light is transparent or semi-transparent.

13. The photodetector according to claim 1, wherein a second electrode of the at least two electrodes which is more distal to incident light is transparent, semi-transparent or opaque.

14. The photodetector according to claim 1, wherein the at least two electrodes comprise transparent conducting oxides, thin metal layer, conducting polymers, organic semiconductors, nanostructured transparent electrode, metal nanoparticles, metal nanowires, graphene sheets, or any combination thereof.

15. The photodetector according to claim 14, wherein a first electrode of the at least two electrodes being more proximal to incident light is selected from a PEDOT:PSS layer, an ITO layer, a surface modified PEDOT:PSS layer or a surface modified ITO layer, and wherein a second electrode of the at least two electrodes being more distal to incident light is selected from an Al layer or an Ag layer or a ZnO-modified Al layer or a ZnO-modified Ag layer.

16. The photodetector according to claim 1, wherein the layered structure further comprises an interlayer sandwiched between a first functional layer and a second functional layer of the at least two functional layers.

17. The photodetector according to claim 1, wherein the at least two electrodes include a first, proximal electrode, and a second, distal electrode with respect to the incident light, the photodetector further comprising an interlayer to the layered structure, the interlayer being configured to assist charge exchange and comprising conducting polymer, metal oxide, self-assembled monolayer, metal nanoparticles, metal nanowires, graphene sheets, or any combination thereof.

18. The photodetector according to claim 1, wherein the photodetector has a photoresponse to a selected spectrum window within a wavelength range from 10 nm to 1000 μm and is operable with or without bias.

19. The photodetector according to claim 1, wherein the spectrum window of the electromagnetic waves detected by the photodetector is tunable based on optical properties of the selected materials for a first functional layer and a second functional layer of the at least two functional layers, which is determined by the difference in wavelengths between transmission cut-off wavelength of the first functional layer and an absorbing edge of the second functional layer.

* * * * *